US012750605B2

(12) United States Patent
Jin

(10) Patent No.: US 12,750,605 B2
(45) Date of Patent: Sep. 29, 2026

(54) IMAGE SENSOR AND DRIVING METHOD THEREOF

(71) Applicant: SAMSUNG ELECTRONICS CO., LTD., Suwon-si (KR)

(72) Inventor: Younggu Jin, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/980,165

(22) Filed: Dec. 13, 2024

(65) Prior Publication Data

US 2025/0358541 A1 Nov. 20, 2025

(30) Foreign Application Priority Data

May 14, 2024 (KR) ........................ 10-2024-0063227

(51) Int. Cl.

| | |
|---|---|
| ***H04N 25/77*** | (2023.01) |
| ***H04N 25/60*** | (2023.01) |
| ***H10F 39/00*** | (2025.01) |
| ***H10F 39/18*** | (2025.01) |

(52) U.S. Cl.

CPC ........... *H04N 25/77* (2023.01); *H10F 39/182* (2025.01); *H10F 39/8033* (2025.01); *H10F 39/80373* (2025.01); *H10F 39/8053* (2025.01); *H10F 39/8063* (2025.01); *H10F 39/807* (2025.01); *H04N 25/60* (2023.01)

(58) Field of Classification Search

None

See application file for complete search history.

(56) References Cited

U.S. PATENT DOCUMENTS

| | | | | |
|---|---|---|---|---|
| 10,630,897 | B2 | 4/2020 | Balar et al. | |
| 10,791,292 | B1 | 9/2020 | Geurts | |
| 10,833,112 | B2 * | 11/2020 | Park | H10F 39/014 |
| 11,089,244 | B2 | 8/2021 | Do et al. | |
| 11,343,439 | B2 | 5/2022 | Johnson | |
| 11,417,691 | B2 * | 8/2022 | Park | H10F 39/80373 |

(Continued)

FOREIGN PATENT DOCUMENTS

JP 6967173 B1 11/2021

OTHER PUBLICATIONS

Communication dated Sep. 30, 2025 issued by the European Patent Office in European Patent Application No. 25172911.7.

*Primary Examiner* — Cynthia Calderon
(74) *Attorney, Agent, or Firm* — Sughrue Mion, PLLC

(57) ABSTRACT

Provided is an image sensor including a pixel including a photoelectric device configured to generate photoelectric charges, a charge storage connected to the photoelectric device and configured to store the photoelectric charges, a driving transistor configured to generate a pixel signal based on a voltage from a first node connected to the photoelectric device, a transfer transistor including a vertical transfer gate connected between the first node and a second node, a first region at a first side of the transfer transistor and doped with a first doping concentration, and a second region at a second side of the transfer transistor and doped with a second doping concentration that is different from the first doping concentration, an overflow transistor between the second node and the charge storage element, and a row driver connected to the pixel and configured to control the pixel.

20 Claims, 30 Drawing Sheets

(56) References Cited

U.S. PATENT DOCUMENTS

| | | | |
|---|---|---|---|
| 11,671,730 B2 | 6/2023 | Miyauchi et al. | |
| 11,736,833 B1 | 8/2023 | Choi | |
| 12,477,846 B2 * | 11/2025 | Zang | H10F 39/014 |
| 2015/0021461 A1 * | 1/2015 | Nishihara | H10F 39/18 250/208.1 |
| 2017/0323912 A1 | 11/2017 | Lahav et al. | |
| 2019/0373168 A1 | 12/2019 | Balar et al. | |
| 2020/0411585 A1 * | 12/2020 | Huang | H10F 39/014 |
| 2021/0025993 A1 * | 1/2021 | Choi | G01S 7/4865 |
| 2021/0176414 A1 | 6/2021 | Do et al. | |
| 2021/0183926 A1 | 6/2021 | Choi et al. | |
| 2021/0243350 A1 | 8/2021 | Johnson | |
| 2021/0289154 A1 | 9/2021 | Johnson et al. | |
| 2022/0053152 A1 | 2/2022 | Ikuma et al. | |
| 2022/0086375 A1 | 3/2022 | Yang et al. | |
| 2022/0385852 A1 | 12/2022 | Miyauchi et al. | |
| 2023/0207584 A1 | 6/2023 | Kudo | |
| 2023/0224602 A1 | 7/2023 | Iida | |
| 2023/0307484 A1 * | 9/2023 | Sun | H10F 39/1865 |
| 2024/0064426 A1 * | 2/2024 | Ayel | H04N 25/77 |
| 2026/0067596 A1 * | 3/2026 | Saxod | H04N 25/78 |

* cited by examiner

IMAGE SENSOR AND DRIVING METHOD THEREOF

CROSS-REFERENCE TO RELATED APPLICATION

This application claims priority to Korean Patent Application No. 10-2024-0063227, filed in the Korean Intellectual Property Office on May 14, 2024, the entirety of which is incorporated herein by reference.

BACKGROUND

1. Field

Embodiments of the present disclosure relate to an image sensor and a driving method of an image sensor.

2. Description of the Related Art

An image sensor is a device that may capture a two-dimensional (2D) or three-dimensional (3D) image of an object. The image sensor generates an image of the object using a photoelectric conversion device that reacts according to intensity of light reflected from the object. Recently, with the advancement of complementary metal-oxide semiconductor (CMOS) technology, CMOS image sensors using CMOS are being widely used.

Recently, as image sensors are installed in various devices, an image sensor that improves characteristics of high dynamic range (HDR) and signal to noise ratio (SNR) in low and high light is required.

SUMMARY

One or more embodiments provide an image sensor that operates in a high-illuminance environment.

According to an aspect of one or more embodiments, there is provided an image sensor including a pixel including a photoelectric device configured to generate photoelectric charges, a charge storage connected to the photoelectric device and configured to store the photoelectric charges, a driving transistor configured to generate a pixel signal based on a voltage from a first node connected to the photoelectric device, a transfer transistor including a vertical transfer gate connected between the first node and a second node, a first region at a first side of the transfer transistor and doped with a first doping concentration, and a second region at a second side of the transfer transistor and doped with a second doping concentration that is different from the first doping concentration, an overflow transistor between the second node and the charge storage element, and a row driver connected to the pixel and configured to control the pixel.

According to another aspect of one or more embodiments, there is provided an image sensor including a semiconductor substrate including a photoelectric conversion region and a first floating diffusion region, a first vertical transfer transistor extending along a thickness direction of the semiconductor substrate and penetrating at least a portion of the semiconductor substrate, a first region between the first floating diffusion region at a first side of the first vertical transfer gate and the photoelectric conversion region, the first region having a first conductivity type, a second region configured to have a second conductivity type at a second side of the first vertical transfer gate, a charge storage at the second side of the first vertical transfer gate, and an overflow transistor between the first vertical transfer gate and the charge storage element.

According to still another aspect of one or more embodiments, there is provided a driving method of an image sensor, including generating first photoelectric charges during a first period in a photoelectric device connected to a first node, transferring the first photoelectric charges to a charge storage connected to the first node through a first region at a first side of a vertical transfer gate and having a first conductivity type, generating second photoelectric charges in the photoelectric device during a second period, transferring the second photoelectric charges to a second node through a second region at a second side of the vertical transfer gate and having a second conductivity type, and generating a pixel signal based on the charges accumulated in the second node.

BRIEF DESCRIPTION OF DRAWINGS

Embodiments will be more clearly understood from the following detailed description taken in conjunction with the accompanying drawings in which.

DETAILED DESCRIPTION

Figure 1:
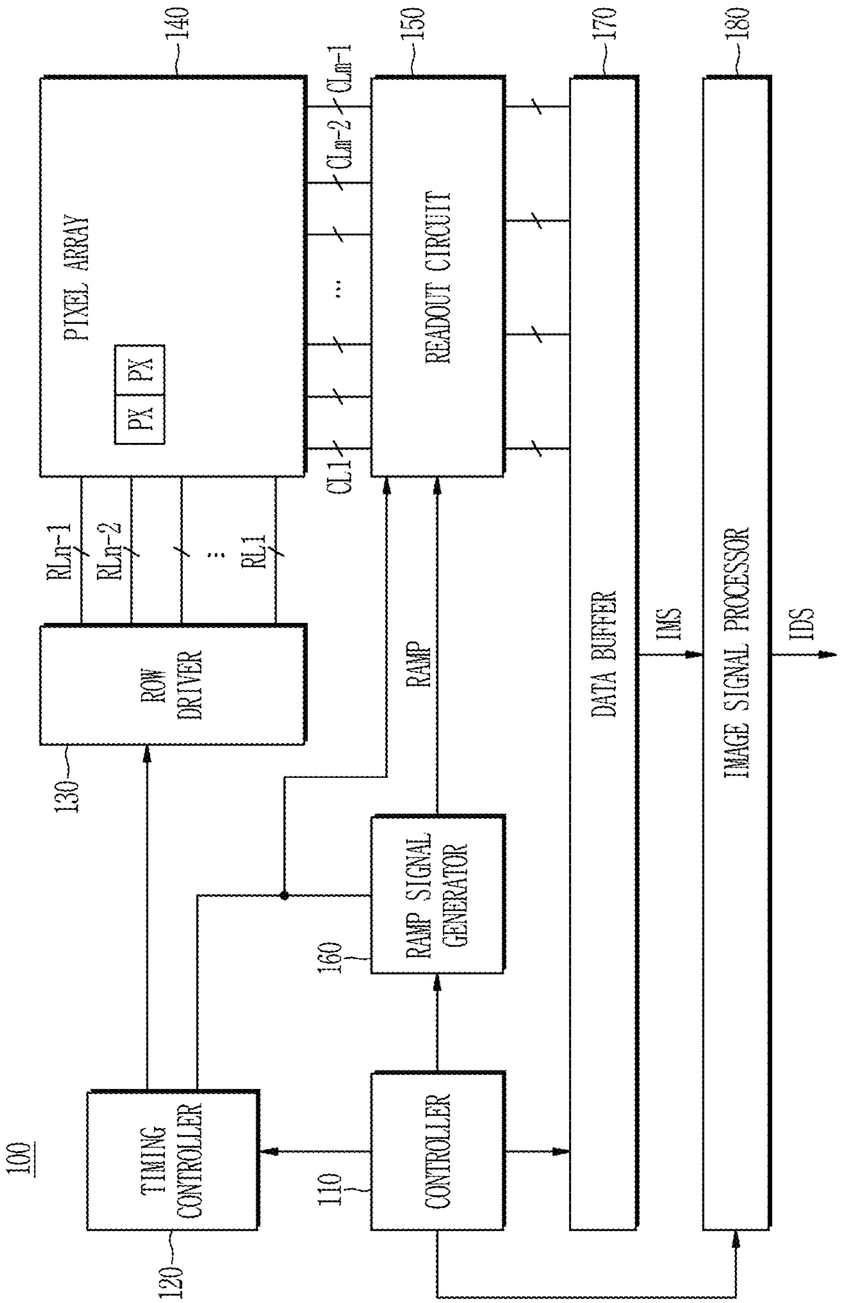
FIG. 1 illustrates an image sensor according to one or more embodiments.

Embodiments of the present disclosure will now be described in detail with reference to the accompanying drawings. The same reference numerals are used for the same components in the drawings, and duplicate descriptions thereof are omitted. Embodiments described herein are example embodiments, and thus, the disclosure is not limited thereto.

It will be understood that, although the terms first, second, third, fourth, etc. may be used herein to describe various elements, components, regions, layers and/or sections (collectively "elements"), these elements should not be limited by these terms. These terms are only used to distinguish one element from another element. Thus, a first element described in this description section may be termed a second element or vice versa in the claim section without departing from the teachings of the disclosure.

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present.

As used herein, an expression "at least one of" preceding a list of elements modifies the entire list of the elements and does not modify the individual elements of the list. For example, an expression, "at least one of a, b, and c" should be understood as including only a, only b, only c, both a and b, both a and c, both b and c, or all of a, b, and c.

FIG. 1 illustrates an image sensor according to one or more embodiments.

Referring to FIG. 1, the image sensor 100 according to one or more embodiments may include a controller 110, a timing generator 120, a row driver 130, a pixel array 140, a read-out circuit 150, a ramp signal generator 160, a data buffer 170, and an image signal processor 180. Although the image sensor 100 is shown in FIG. 1 as including the image signal processor 180, embodiments are not limited thereto, and the image signal processor 180 may be positioned outside the image sensor 100.

The image sensor 100 may be mounted on an electronic device having an image or light sensing function. For example, the image sensor 100 may be mounted on an electronic device such as a camera, a smartphone, a wearable device, an Internet of things (IoT) devices, a home appliance, a tablet personal computer (PC), a personal digital assistant (PDA), a portable multimedia player (PMP), a navigation device, a drone, an advanced driver assistance system (ADAS), etc. Alternatively, the image sensor 100 may be mounted on an electronic device provided as a part of a vehicle, a furniture, a manufacturing facility, a door, or various measuring devices.

The controller 110 may generally control each of the components 120, 130, 140, 150, 160, 170, and 180 included in the image sensor 100. The controller 110 may control operation timing of each component 120, 130, 140, 150, 160, 170, and 180 using control signals.

In some embodiments, the controller 110 may control the ramp signal generator 160 to adjust a reference signal RAMP generated by the ramp signal generator 160. In some embodiments, the controller 110 can control the timing controller 120 to adjust capacitance of floating diffusion (FD) of a pixel circuit in the pixel array 140 through the row driver 130. In some embodiments, the controller 110 may control the timing controller 120 to adjust operation timings of elements in the pixel array 140 through the row driver 130.

The timing generator 120 may generate a signal that operates as a reference for operation timings of components of the image sensor 100. The timing generator 120 may control the timings of the row driver 130, the read-out circuit 150, and the ramp signal generator 160. The timing generator 120 may provide a control signal that controls the timings of the row driver 130, the read-out circuit 150, and the ramp signal generator 160.

The timing controller 120 may control timings of elements within a pixel PX during a reset period, an integration period, and a read-out period. The reset section may be a period in which charges accumulated in floating diffusion nodes within the pixel PX are reset. The integration period may be a period in which a photoelectric device is exposed to light to generate photoelectric charges. The lead-out period may be a period in which the photoelectric charges generated by the photoelectric device are transferred to the read-out circuit 150.

In some embodiments, the controller 110 may control the timing controller 120 to divide and transfer the photoelectric charges generated by the photoelectric device during the integration period to a plurality of nodes connected to the photoelectric device. For example, the controller 110 may control the timing controller 120 to transmit the photoelectric charges to a first node during a first section of the integration period and to transmit the photoelectric charges to a second node during a second section of the integration period. In some embodiments, a charge storage may be connected to the second node.

The pixel array 140 may include a plurality of pixels PX, and a plurality of row lines RL and a plurality of column lines CL respectively connected to the pixels PX. In some embodiments, each of the pixels PX may include at least one photoelectric device (also referred to as a photosensing device). The photoelectric device may detect incident light, and may convert the incident light into an electric signal according to an amount of light, i.e., a plurality of analog pixel signals. A level of an analog pixel signal outputted from the photoelectric device may be increased as an amount of charge outputted from the photoelectric device increases. That is, the level of the analog pixel signal output from the photoelectric device may be increased as an amount of light received into the pixel array 140 increases.

The row lines RL1 to RL(n−1) (RL) may extend in a first direction (X direction), and may be connected to the pixels PX positioned along the first direction (X direction). For example, the row lines RL may transmit a control signal outputted from the row driver 130 to an element, e.g., a transistor, provided in a pixel. In addition to the row lines RL, other signal lines may be arranged in the first direction (X direction). A plurality of column lines CL1 to CL(m−1) (CL) may extend in a second direction intersecting the first direction (X direction), and may be connected to a plurality of pixels (PX) arranged along the second direction. The column lines CL may transmit pixel signals outputted from the pixels PX to the read-out circuit 150.

The row driver 130 may generate a control signal for driving the pixel array 140 in response to a control signal of the timing generator 120, and control signals may be supplied to the pixels PX of the pixel array 140 through the row lines RL. In one or more embodiments, the row driver 130 may control the pixels PX to sense light incident in a row line unit. The row line unit may include at least one row line RL.

In response to the control signal from the timing generator 120, the read-out circuit 150 may convert pixel signals (or electric signals) from the pixels PX connected to the row line RL selected from among the pixels PX into pixel values representing an amount of light. The read-out circuit 150 may include a correlated double sampling circuit and an analog-digital conversion (ADC) circuit.

The correlated double sampling (CDS) circuit may include a plurality of comparators, and each of the comparators may compare a pixel signal received from the pixel array 140 through the column lines CL with the reference signal RAMP from the ramp generator 160. For example, the correlated double sampling circuit 151 may compare the received pixel signal with the reference signal RAMP, and may output a comparison result thereof to an analog-to-digital conversion circuit.

A plurality of pixel signals outputted from the pixels PX may have a deviation due to a unique characteristic (e.g. fixed pattern noise (FPN), etc.) of each pixel and/or a difference in characteristics of pixel circuits (e.g., transistors for outputting charges stored in photoelectric conversion elements within a pixel) for outputting the pixel signals from the pixels PX. In order to compensate for the deviation between the pixel signals outputted through the column lines CL, a way of obtaining a reset component (e.g., reset voltage) and a sensing component (e.g., sensing voltage) for a pixel signal and extracting a difference (e.g., a difference between the reset voltage and the sensing voltage) as a valid signal component is called correlated double sampling. The correlated double sampling circuit may output a comparison result thereof using a correlated double sampling technique for the received pixel signals.

The analog-to-digital conversion circuit may generate and output pixel values corresponding to the pixels on a row-by-row basis by converting the comparison result of the correlated double sampling circuit into digital data. The analog-to-digital conversion circuit may include a plurality of counters. A counter may be implemented as an up-counter whose count value sequentially increases based on a counting clock signal and an operation circuit, or an up/down counter, or a bit-wise inversion counter. The counters may be connected to an output of each of the comparators. Each of the counters may count a comparison result outputted from a corresponding comparator, and output digital data (e.g., a pixel value) according to a counting result.

The ramp signal generator 160 may generate the reference signal RAMP to transmit it to the read-out circuit 150. The lamp signal generator 160 may include a current source, a resistor, and a capacitor. The lamp signal generator 160 may generate a plurality of ramp signals that fall or rise with a slope determined according to a current magnitude of a variable current source or a resistance value of a variable resistor by adjusting a lamp voltage, which is a voltage applied to lamp resistance, adjusting the current magnitude of the variable current source or the resistance value of the variable resistor.

The data buffer 170 may store pixel values of the pixels PX connected to a selected column line CL transmitted from the read-out circuit 150. The data buffer 170 may output a pixel value stored in response to an enable signal from the controller 110 to the image signal processor 180 as an image output signal IMS.

The image signal processor 180 may perform image signal processing on the image output signal IMS received from the data buffer 170. For example, the image signal processor 180 may receive a plurality of image output signals IMS from the data buffer 170, and may generate image data IDS by synthesizing the received image output signals IMS.

Figure 2:
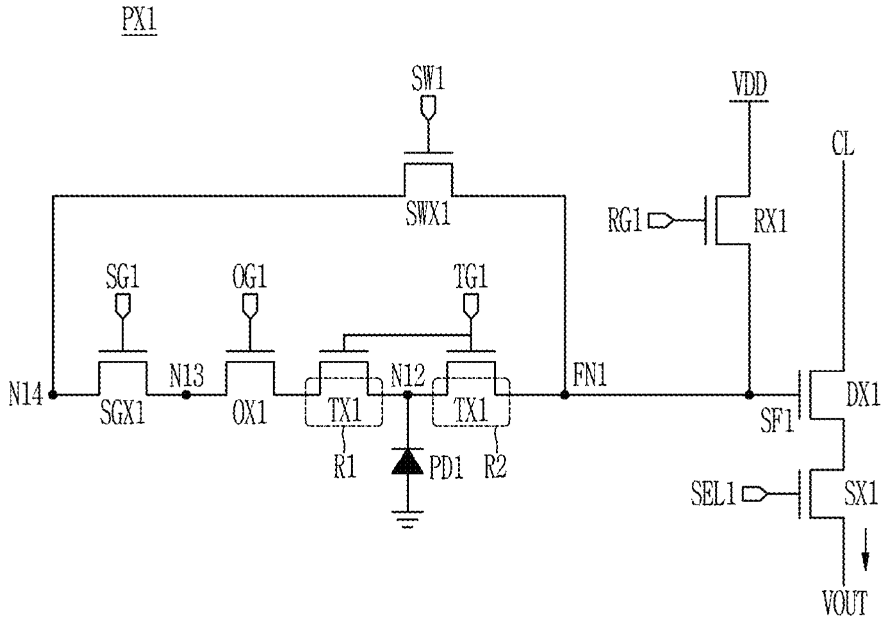
FIG. 2 illustrates a circuit diagram of a pixel according to one or more embodiments.

FIG. 2 illustrates a circuit diagram of a pixel according to one or more embodiments.

As shown in FIG. 2, a pixel PX1 may include a photoelectric device PD1 that generates charges in response to light and a pixel circuit that output an electrical signal by processing the charges generated by the photoelectric device PD1.

The photoelectric device PD1 may generate photoelectric charges that vary depending on the intensity of light. For example, a cathode of the photoelectric device PD1 may be connected to a first floating diffusion node FN1 through a first transfer transistor TX1, and an anode of the photoelectric device PD1 may be grounded.

A pixel circuit may include a plurality of transistors, e.g., a first transfer transistor TX1, a first reset transistor RX1, a first driving transistor DX1, a first selection transistor SX1, a first switch transistor SWX1, a first overflow transistor OX1, and a storage gate transistor SGX1.

Control signals TG1, RG1, SEL1, SW1, OG1, and SG1 may be applied to the pixel PX1. In one or more embodiments, control signals may be generated in the row driver 130 (in FIG. 1) based on control of the timing controller 120. The transistors TX1, RX1, SX1, SWX1, OX1, and SGX1 in the pixel circuit may operate in response to control signals supplied from the row driver 130, e.g., a transfer control signal TG1, a reset control signal RG1, a selection signal SEL1, a switch control signal SW1, an overflow control signal OG1, and a storage control signal SG1.

The first transfer transistor TX1 may be connected between the photoelectric device PD1 and the first floating diffusion node FN1. The first transfer transistor TX1 may be controlled by the transfer control signal TG1. When the first transfer transistor TX1 is turned on, the charges generated in the photoelectric device PD1 may be transferred to the first floating diffusion node FN1.

A voltage of the first floating diffusion node FN1 may be determined according to an amount of charges accumulated in the first floating diffusion node FN1. A conversion gain, which is a rate at which charges are converted to a voltage, may be inversely proportional to a magnitude of capacitance of the first floating diffusion node FN1. For example, as the capacitance of the first floating diffusion node FN1 increases, the conversion gain may decrease, and as the capacitance decreases, the conversion gain may increase.

In one or more embodiments, the first transfer transistor TX1 may include a vertical transfer gate. A gate electrode of the first transfer transistor TX1 may extend along a thickness direction of a semiconductor substrate. A first side of the first transfer transistor TX1 may have a first potential, and a second side of the first transfer transistor TX1 may have a second potential that is different from the first potential.

In one or more embodiments, a doping concentration at the first side and a doping concentration at the second side may be different based on the first transfer transistor TX1. For example, a first region R1 of the first transfer transistor TX1 between the photoelectric device PD1 and the overflow transistor OX1 has a first doping concentration, and a second region R2 of the first transfer transistor TX1 between the photoelectric device PD1 and the first floating diffusion node FN1 may have a second doping concentration.

In one or more embodiments, the first region R1 may be a region doped with n-type impurities. For example, the first region R1 may be doped with n-type impurities through an ion implantation process. As will be described later, photoelectric charges generated in the photoelectric device PD1 may move to the storage gate transistor SGX1 through the first region R1.

In one or more embodiments, the second region R2 may be a region doped with p-type impurities. For example, the second region R2 may be doped with p-type impurities through an ion implantation process. For example, the second region R2 may operate as a p-well region for the first transfer transistor TX1.

In one or more embodiments, a thickness of an oxide at a first side of the gate electrode may be different from a thickness of the oxide at a second side of the gate electrode with respect to the first transfer transistor TX1.

The first reset transistor RX1 may be connected between a power voltage line supplying a power voltage VDD and the first floating diffusion node FN1. The first reset transistor RX1 may be controlled by the reset control signal RG1. When the first reset transistor RX1 is turned on, the power voltage VDD may be applied to the first floating diffusion node FN1 to reset the first floating diffusion node FN1.

A gate of the first driving transistor DX1 may be connected to the first floating diffusion node FN1. The first driving transistor DX1 may operate as a source-follower amplifier for a voltage of the first floating diffusion node FN1. The first driving transistor DX1 may output a pixel signal VOUT to the column line CL through the first selection transistor SX1 in response to the voltage of the first floating diffusion node FN1.

The first selection transistor SX1 may be connected to a first terminal of the first driving transistor DX1 and the column line CL, to be controlled by the selection control signal SEL1. When the first selection transistor SX1 is turned on, the pixel voltage VOUT outputted from the first driving transistor DX1 may be outputted to the read-out circuit 150 (in FIG. 1) through the column line CL connected to the first selection transistor SX1. For example, when the first selection transistor SX1 is turned on in a read-out operation, a pixel signal including a reset signal corresponding to a reset operation or an image signal corresponding to a charge accumulation operation may be outputted through the column line CL.

The first switch transistor SWX1 may be connected between the first floating diffusion node FN1 and a fourth node N14. The first switch transistor SWX1 may be controlled by the switch control signal SW1.

The first overflow transistor OX1 may be connected between the photoelectric device PD1 and a third node N13. The first overflow transistor OX1 may be controlled by the overflow control signal OG1. When the first overflow transistor OX1 is turned on, the charge generated in the photoelectric device PD1 may be transferred to the third node N13. In one or more embodiments, an amount of charges generated in the photoelectric device PD1 and transferred to the third node N13 may be controlled based on a magnitude of the overflow control signal OG1 applied to the first overflow transistor OX1.

In one or more embodiments, the first overflow transistor OX1 may be used to control the transfer of the photoelectric charges generated by the photoelectric device PD1 to the storage gate transistor SGX1. For example, the first overflow transistor OX1 may control overflow of one or more of the photoelectric charges exceeding capacity of the photoelectric device PD1 into the storage gate transistor SGX1. For example, in a relatively high-intensity environment where intensity of incident light entering the pixel PX1 is relatively very high, the first overflow transistor OX1 may transfer one or more of the photoelectric charges overflowing from the photoelectric device PD1 to the storage gate transistor SGX1.

The storage gate transistor SGX1 may be connected between the third node N13 and the fourth node N14. The storage gate transistor SGX1 may be controlled by the storage control signal SG1. The storage gate transistor SGX1 may be a charge storage device capable of storing photoelectric charges generated by the photoelectric device PD1. The storage gate transistor SGX1 may be controlled by the storage gate signal SG1. In one or more embodiments, an amount of charges that can be stored in the storage gate transistor SGX1 may vary based on the storage gate signal SG1. In one or more embodiments, the storage gate transistor SGX1 may have a structure that includes additional storage diodes at a lower portion thereof.

Figure 3:
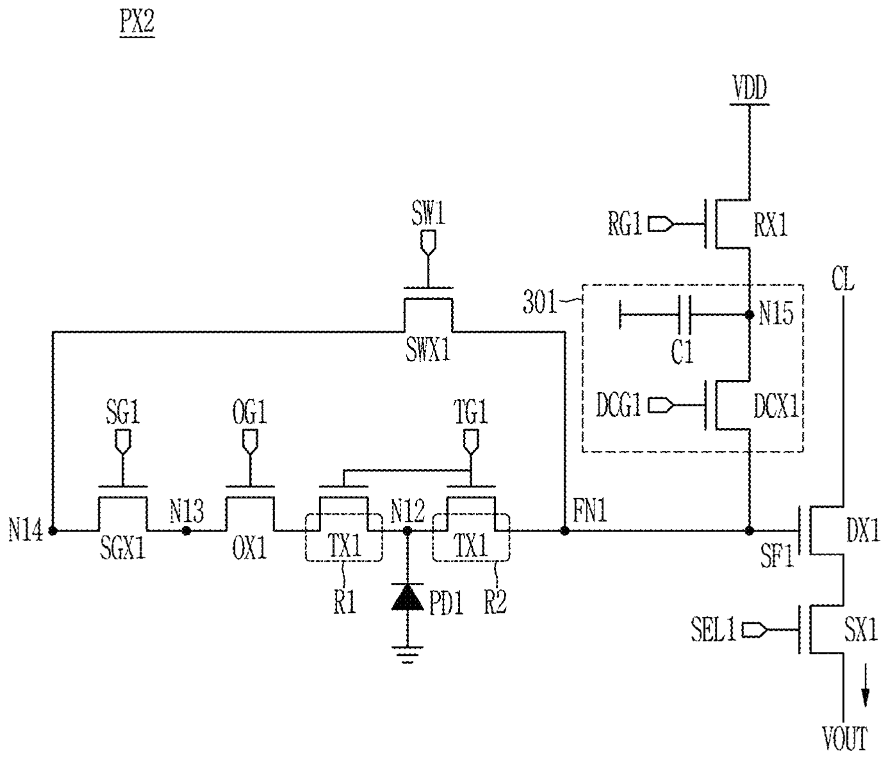
FIG. 3 illustrates a circuit diagram of a pixel according to one or more embodiments.

FIG. 3 illustrates a circuit diagram of a pixel according to one or more embodiments.

As shown in FIG. 3, a pixel PX2 may include a photoelectric device PD1 and a pixel circuit that outputs an electrical signal by processing the charges generated by the photoelectric device PD1.

A pixel circuit may include a plurality of transistors, e.g., a first transfer transistor TX1, a first reset transistor RX1, a first driving transistor DX1, a first selection transistor SX1, a first switch transistor SWX1, a first overflow transistor OX1, and a storage gate transistor SGX1.

In one or more embodiments, the pixel circuit may further include a dual conversion gain circuit 301. For example, the dual conversion gain circuit 301 may be connected in series with the first reset transistor RX1. For example, the dual conversion gain circuit 301 may include a first gain control transistor DCX1 and a first capacitor C1.

The first gain control transistor DCX1 may be connected between the first floating diffusion node FN1 and a fifth node N15. The first gain control transistor DCX1 may be controlled by the gain control signal DCG1. When the first gain control transistor DCX1 is turned on, the first floating diffusion node FN1 and the first capacitor C1 are connected, accordingly, capacitance of the first floating diffusion node FN1 may increase, and the conversion gain, which is a rate at which charges are converted to a voltage, may decrease. For example, when the first gain control transistor DCX1 is turned on, it may operate in a low conversion gain (LCG) mode. When the first gain control transistor DCX1 is turned off, it may operate in a high conversion gain (HCG) mode.

Figure 4:
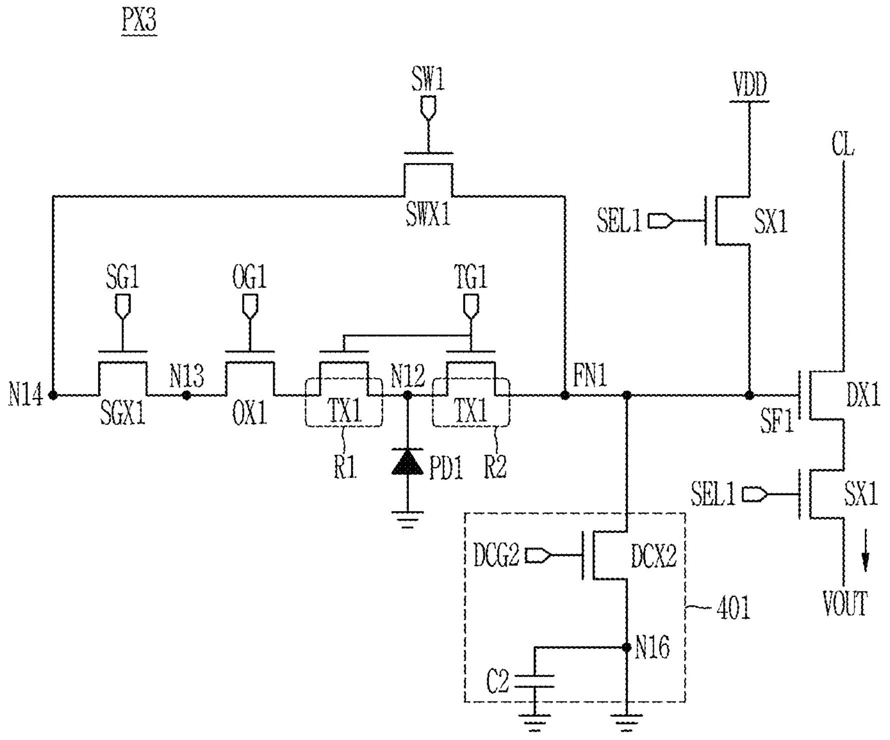
FIG. 4 illustrates a circuit diagram of a pixel according to one or more embodiments.

FIG. 4 illustrates a circuit diagram of a pixel according to one or more embodiments.

As shown in FIG. 4, a pixel PX4 may include a photoelectric device PD1 and a pixel circuit that output an electrical signal by processing the charges generated by the photoelectric device PD1.

A pixel circuit may include a plurality of transistors, e.g., a first transfer transistor TX1, a first reset transistor RX1, a first driving transistor DX1, a first selection transistor SX1, a first switch transistor SWX1, a first overflow transistor OX1, and a storage gate transistor SGX1.

In one or more embodiments, the pixel circuit may further include a dual conversion gain circuit 401. For example, the dual conversion gain circuit 401 may be connected in parallel with the first reset transistor RX1. For example, the dual conversion gain circuit 401 may include a second gain control transistor DCX2 and a second capacitor C2.

The second gain control transistor DCX2 may be connected between the first floating diffusion node FN1 and a sixth node N16. The second gain control transistor DCX2 may be controlled by the gain control signal DCG2. When the second gain control transistor DCX2 is turned on, the first floating diffusion node FN1 and the second capacitor C2 are connected, accordingly, capacitance of the first floating diffusion node FN1 may increase, and the conversion gain, which is a rate at which charges are converted to a voltage, may decrease. For example, when the second gain control transistor DCX2 is turned on, it may operate in a low conversion gain (LCG) mode. When the second gain control transistor DCX2 is turned off, it may operate in a high conversion gain (HCG) mode.

Figure 5:
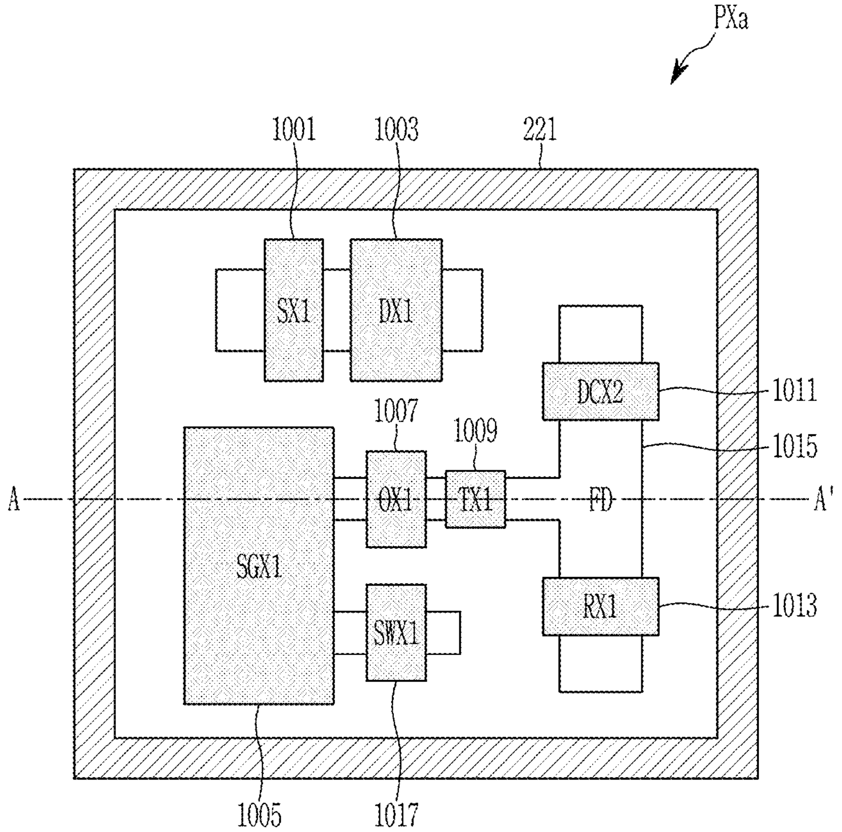
FIG. 5 illustrates a top plan view schematically showing a pixel according to one or more embodiments.
Figure 6:
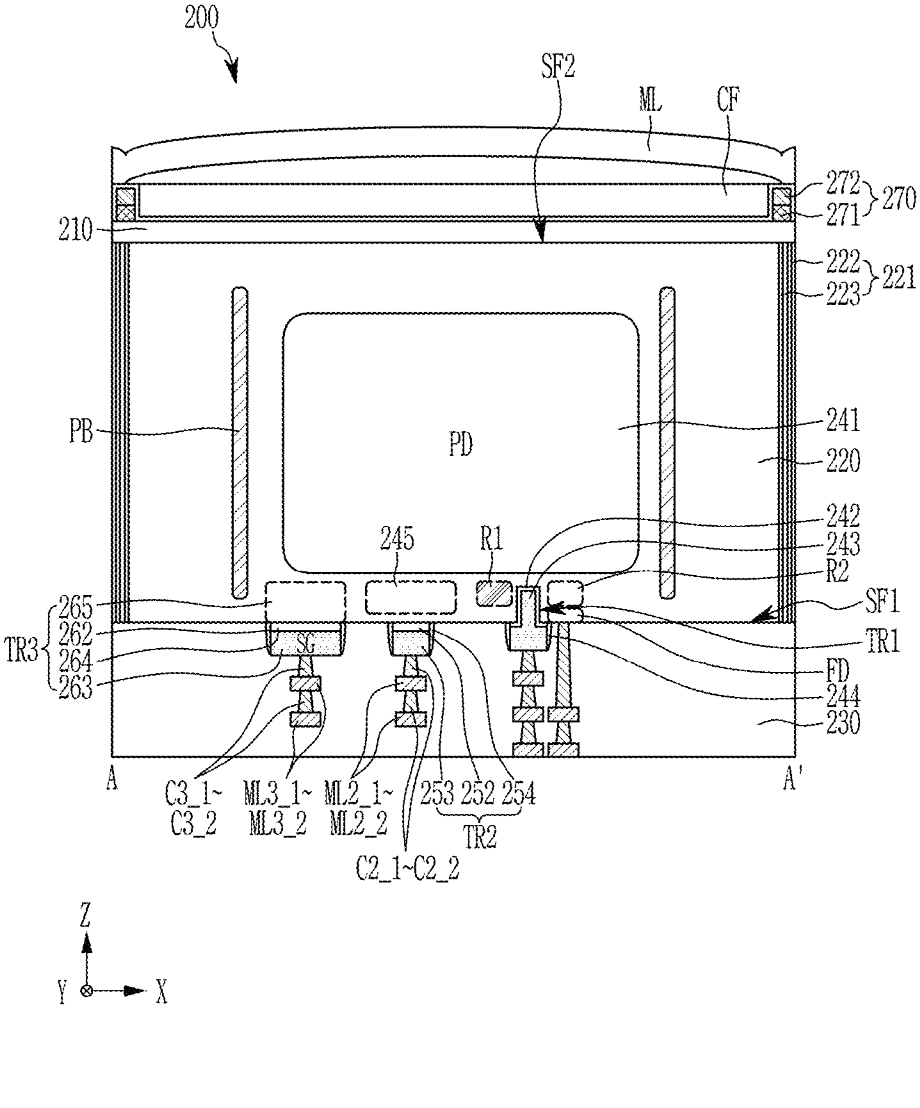
FIG. 6 illustrates schematic cross-sectional view of the pixel according to FIG. 5.

FIG. 5 illustrates a top plan view schematically showing a pixel according to one or more embodiments. FIG. 6 illustrates schematic cross-sectional view of the pixel according to FIG. 5. For example, FIG. 6 illustrates a cross-sectional view of a pixel Pxa taken along a line A-A' of FIG. 5.

Referring to FIG. 5, the pixel Pxa may include a plurality of transistors, e.g., a first transfer transistor TX1 (1009), a first reset transistor RX1 (1013), a first driving transistor DX1 (1003), a first selection transistor SX1 (1001), a first switch transistor SWX1 (1017), a first overflow transistor OX1 (1007), a storage gate transistor SGX1 (1005), and a second gain control transistor DCX2 (1011).

Additionally, referring to FIG. 6, a pixel array 200 may include a micro lens ML, a color filter layer CF, a surface insulating layer 210, a semiconductor substrate 220, a pixel isolation pattern 221, and an insulating layer 230.

The micro lens ML may have a convex shape, and may have a predetermined radius of curvature. Micro lenses ML may be arranged to correspond to each pixel region.

The color filter layer CF may be disposed below the micro lens ML. The color filter layer CF may be disposed on the surface insulating layer 210. The color filter CF may be arranged to correspond to each unit pixel. Each color filter CF may be arranged two-dimensionally in a top plan view. The color filter layer CF may pass reflected light incident through the micro lens ML, and may allow only light of the required wavelength to enter a photoelectric conversion region 241. The color filter layer CF may be referred to as a color filter array. In one or more embodiments, the color filter layer CF may be omitted to acquire only color images, infrared images, or depth images.

The surface insulating layer 210 may be stacked on a second surface SF2 of the semiconductor substrate 220.

A color filter grid 270 may be positioned in a mesh shape between the color filters CF. The color filter grid 270 may define a region where the color filter CF is positioned. In one or more embodiments, at least a portion of the color filter grid 270 may overlap the pixel isolation pattern 221 in a third direction (Z direction).

The color filter grid 270 may be formed on the surface insulation layer 210. The color filter grid 270 may include, e.g., a metal pattern 271 and a low refractive index pattern 272. The metal pattern 271 and the low refractive index pattern 272 may be sequentially stacked on the surface insulation layer 210.

The semiconductor substrate 220 may be, e.g., bulk silicon or silicon-on-insulator (SOI). The semiconductor substrate 220 may be a silicon substrate, or may include another material, such as silicon germanium, indium antimonide, lead telluride, indium arsenide, indium phosphide, gallium arsenide, or gallium antimonide. Alternatively, the semiconductor substrate 220 may have an epitaxial layer formed on a base substrate. In one or more embodiments, the semiconductor substrate 220 may have a first conductivity type. For example, the first conductivity type may be P-type.

The semiconductor substrate 220 may include a first surface SF1 and a second surface SF2 that are opposite to each other. The first surface SF1 may be referred to as a front side of the semiconductor substrate 220, and the second surface SF2 may be referred to as a back side of the semiconductor substrate 220. In one or more embodiments, the second surface SF2 of the semiconductor substrate 220 may be a light-receiving surface on which light is incident and a photoelectric conversion region 241 is exposed.

The semiconductor substrate 220 may include the photoelectric conversion region 241, and the photoelectric conversion region 241 may have a second conductivity type. For example, the second conductivity type may be n-type. A photoelectric conversion device (PD) may be formed by PN junction of the n-type photoelectric conversion region 241 and the p-type substrate 220.

The semiconductor substrate 220 may include a P-type barrier PB. The P-type barrier PB may be positioned to be spaced apart from the photoelectric conversion region 241 by a certain distance. For example, each P-type barrier PB may be formed to be spaced apart from each photoelectric conversion region 241 in the first direction (X direction) and the second direction (Y direction). Additionally, the P-type barrier PB may extend in the third direction (Z direction) along the photoelectric conversion region 241. For example, the P-type barrier PB may be formed vertically within the semiconductor substrate 220. The P-type barrier PB may be doped with p-type impurities.

The pixel isolation pattern 221 may be positioned on an outer surface of the semiconductor substrate 220 or between the pixels. The pixel isolation pattern 221 may be, e.g., an insulating material made of an oxide, a nitride, an oxynitride or a combination thereof. In one or more embodiments, the pixel isolation pattern 221 may be formed to include a conductive material layer and a cover insulating layer surrounding the conductive material layer. For example, the conductive material layer may include polysilicon, metal, or an oxide such as metal nitride or silicon oxide ($SiO_2$), and the cover insulating layer may include an oxide, a nitride, an oxynitride, or a combination thereof.

The pixel isolation pattern 221 may be positioned within the semiconductor substrate 220. The pixel isolation pattern 221 may define a plurality of unit pixels. The unit pixels may be arranged two-dimensionally in a top plan view. For example, the pixel isolation pattern 221 may be formed in a grid shape in a top plan view to separate the unit pixels from each other. The pixel isolation pattern 221 may be formed by filling an insulating material in a deep trench formed by patterning the semiconductor substrate 220.

In one or more embodiments, the pixel isolation pattern 221 may include an insulating spacer layer 222 and a conductive filling pattern 223. The insulating spacer layer 222 may extend conformally along a side surface of the trench within the semiconductor substrate 220. The conductive filling pattern 223 may be formed on the insulating spacer layer 222 to fill a portion of the trench within the semiconductor substrate 220.

In one or more embodiments, the pixel isolation pattern 221 may be a frontside deep trench isolation (FDTI) pattern.

In FIG. 6, an example is illustrated where the pixel isolation pattern 221 is an FDTI pattern extending through the substrate 110 from the first surface SF1 to the second surface SF2 of the semiconductor substrate 220, but embodiments are not limited thereto, and the pixel isolation pattern 221 may be a backside deep trench isolation (BDTI) pattern.

The insulating layer 230 may include a first transistor TR1, a second transistor TR2, a third transistor TR3, etc.

In one or more embodiments, the first transistor TR1 may be positioned on the first surface SF1 of the semiconductor substrate 220. The first transistor TR1 may be a transfer transistor of the image sensor 100 (in FIG. 1). Referring to FIG. 5, the second gain control transistor DCX2 (1011) and the first reset transistor RX1 (1013) may be arranged to be spaced apart from each other with the floating diffusion region FD therebetween. The first transistor TR1 may be the first transfer transistor TX1 (1009) of FIG. 5. As will be described later, the overflow transistor OX1 (1007) may be positioned at a first side of the first transfer transistor TX1 (1009), and the floating diffusion region FD may be positioned at a second side.

In one or more embodiments, the first transistor TR1 may be implemented as a vertical transfer gate (VTG) structure.

The first transistor TR1 may transfer a sensing signal (charge) generated in the corresponding photoelectric conversion region 241 to a floating diffusion region. An impurity region corresponding to the source/drain of the transfer transistor according to one or more embodiments may be the floating diffusion region FD.

The first transistor TR1 may include a gate insulating layer 242, a gate electrode 243, a gate spacer 244, a first region R1, and a second region R2. The gate insulating layer 242 may be formed along a trench formed in the semiconductor substrate 220. The gate electrode 243 may fill a region defined by the gate insulating layer 242 and the gate spacer 244. In one or more embodiments, the first region R1 may be a region of the semiconductor substrate 220 doped with n-type ions, and the second region R2 may be a region of the semiconductor substrate 220 doped with p-type ions. In one or more embodiments, the first region R1 may be a region in the semiconductor substrate 220 doped with p-type ions, and the second region R2 may be a region in the semiconductor substrate 220 doped with a large amount of p-type ions.

The gate electrode 243 may operate as a gate of the first transistor TR1. For example, the gate electrode 243 may include a metal such as poly-silicon (Poly-Si) or tungsten (W) and/or a conductive metal nitride.

In FIG. 6, the gate electrode 243 of the first transistor TR1 is shown as having an oxide layer of a same thickness at opposite sides, but embodiments are not limited thereto, and opposite sides of the gate electrode 243 may have oxide layers of different thicknesses.

In one or more embodiments, the second transistor TR2 may be positioned on the first surface SF1 of the semiconductor substrate 220. The second transistor TR2 may be the overflow transistor OX1 (in FIG. 4) of the image sensor 100 (in FIG. 1). The second transistor TR2 may be the overflow transistor OX1 (1007) of FIG. 5. Referring to FIG. 5 together, the first storage gate transistor SGX1 (1005) and the overflow transistor OX1 (1007) may be positioned at a first side of the first transfer transistor TX1 (1009). The photoelectric conversion region 241 may be positioned on at least a portion of the second transistor TR2. The second transistor TR2 may include a gate insulating layer 252, a gate electrode 253, and a gate spacer 254.

The gate electrode 253 may fill a region defined by the gate insulating layer 252 and the gate spacer 254. The gate electrode 253 may operate as a gate of the second transistor TR2.

The second metal layers ML2_1 and ML2_2 may be formed in the insulating layer 230 and may extend in the first direction (X direction) or the second direction (Y direction). The second metal layers ML2_1 to ML2_2 may be sequentially disposed from the first surface SF1 of the semiconductor substrate 220 where the second transistor TR2 is positioned. For example, the second_1 metal layer ML2_1 may be disposed closest to the second transistor TR2, and the second_2 metal layer ML2_2 may be disposed farthest from the second transistor TR2. Each thickness of the second metal layers ML2_1 and ML2_2 may be the same, but embodiments according to the technical idea of the present disclosure are not limited thereto. In FIG. 6, two second metal layers ML2_1 and ML2_2 are illustrated, but embodiments are not limited thereto, and a plurality of second metal layers ML2_1 and ML2_2 may be provided.

The second metal layers ML2_1 and ML2_2 may be connected by a plurality of second contacts C2_1 and C2_2. For example, the second metal layer ML2_1 may be connected to the second metal layer ML2_2 by a second_1 contact C2_1 extending in the third direction (Z direction).

In one or more embodiments, the pixel array 200 may further include an impurity implant region 245. The impurity implant region 245 may be a doped region within the semiconductor substrate 220 corresponding to the second transistor TR2 to adjust the threshold voltage of the second transistor TR2.

The second transistor TR3 may be positioned on the first surface SF1 of the semiconductor substrate 220. The third transistor TR3 may be the storage gate transistor SGX1 (in FIG. 4) of the image sensor 100 (in FIG. 1). The third transistor TR3 may include a gate insulating layer 262, a gate electrode 263, a gate spacer 264, and a charge storage region 265. An area of the first storage gate transistor SGX1 (1005) may be larger than an area of the first transfer transistor TX1 (1009).

The charge storage region 265 may be positioned within the semiconductor substrate 220 below the third transistor TR3. The charge storage region 265 may have a first conductivity type.

For example, the charge storage region 265 may be positioned between the first surface SF1 and the barrier impurity region at a position vertically overlapping the third transistor TR3, and may be a temporary charge storage region where photoelectric charges generated in the photoelectric conversion region 241 are temporarily stored before being transferred to the floating diffusion region FD. At least a portion of the charge storage region 265 may overlap the photoelectric conversion region 241 in the third direction (Z direction).

In one or more embodiments, a storage diode may be formed at a lower portion of the third transistor TR3. Herein, the first overflow transistor OX1 may create an overflow path between the photoelectric conversion region 241 and the storage diode. To this end, the impurity implant region 245 may be positioned between the gate electrode 253 and the photoelectric conversion region 241 of the first overflow transistor OX1 and between the gate electrode 253 and the storage diode.

Referring to FIG. 5 together, the overflow transistor OX1 (1007) may control the transfer of photoelectric charges temporarily stored in the charge storage region 265 of the first storage gate transistor SGX1 (1005) to the floating diffusion region (1015). The overflow transistor OX1 (1007) may be positioned between the first storage gate transistor SGX1 (1005) and the first transfer transistor TX1 (1009). For example, the overflow transistor OX1 (1007) may be positioned to be spaced apart from the first storage gate transistor SGX1 (1005) in the first direction (X direction). The overflow transistor SWX1 (1017) may be positioned to be spaced apart from the first storage gate transistor SGX1 (1005) in a first direction (X direction) and to be spaced apart from the overflow transistor OX1 (1007) in the second direction.

The first driving transistor DX1 (1003) may be connected between a conductor to which the power voltage VDD is supplied and the first selection transistor SX1 (1001). The first selection transistor SX1 (1001) may be connected to the first driving transistor DX1 (1003).

Figure 7:
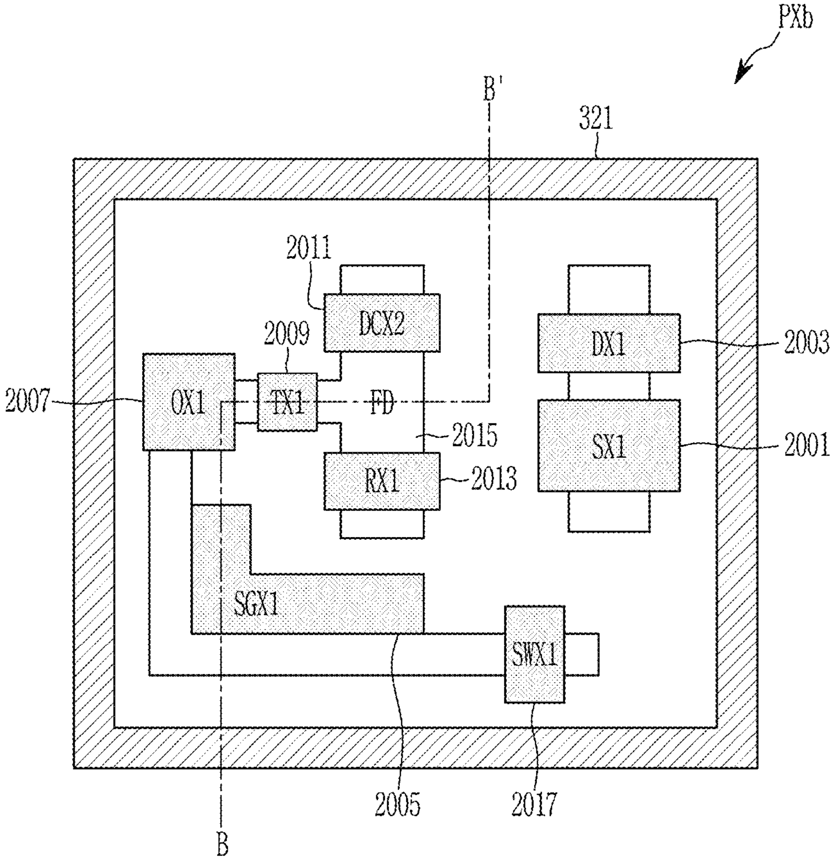
FIG. 7 illustrates a top plan view schematically showing a pixel according to one or more embodiments.
Figure 8:
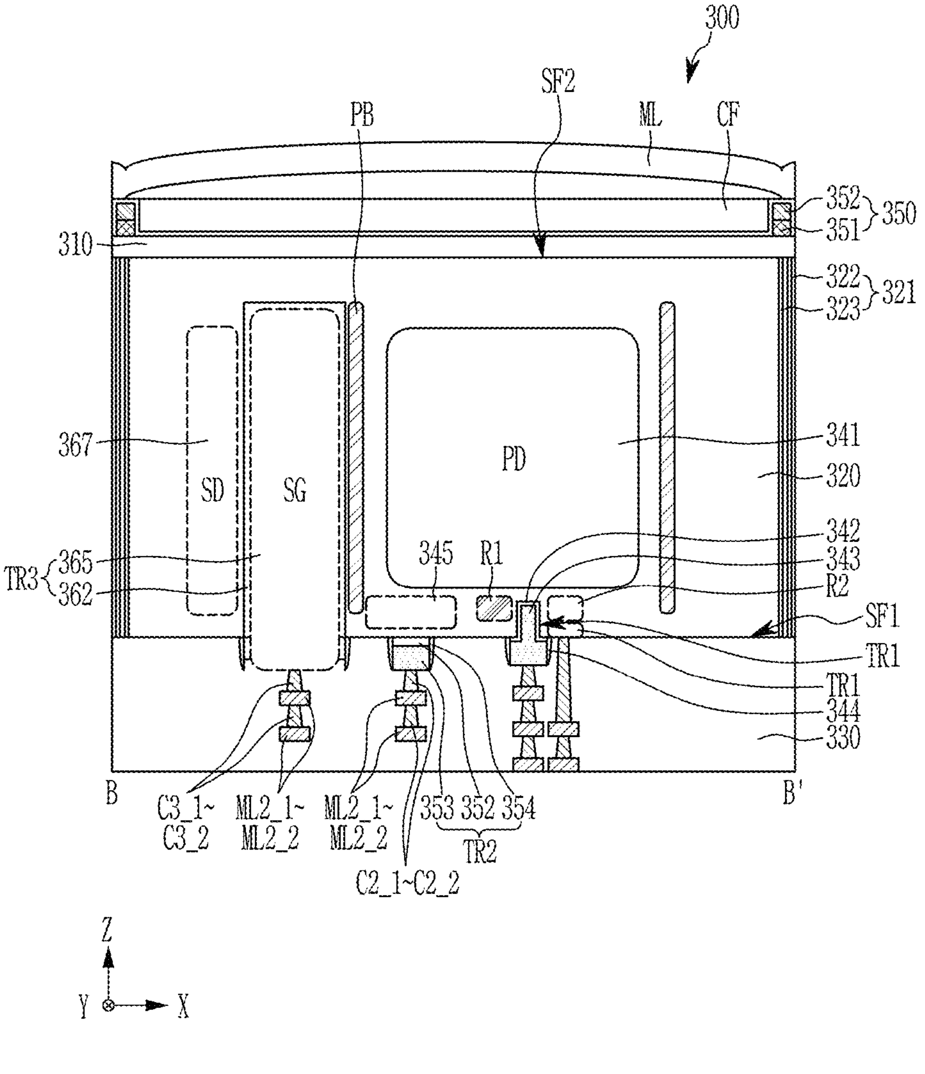
FIG. 8 illustrates schematic cross-sectional view of the pixel according to FIG. 7.

FIG. 7 illustrates a top plan view schematically showing a pixel according to one or more embodiments. FIG. 8 illustrates schematic cross-sectional view of the pixel according to FIG. 7. For example, FIG. 8 illustrates a cross-sectional view of a pixel Pxb taken along a line B-B' of FIG. 7.

Referring to FIG. 7, the pixel Pxb may include a plurality of transistors, e.g., a first transfer transistor TX1 (2009), a first reset transistor RX1 (2013), a first driving transistor DX1 (2003), a first selection transistor SX1 (2001), a first switch transistor SWX1 (2017), a first overflow transistor OX1 (2007), a storage gate transistor SGX1 (2005), and a second gain control transistor DCX2 (2011).

Referring to FIG. 8, a pixel array 300 may include a micro lens ML, a color filter layer CF, a surface insulating layer 310, a semiconductor substrate 320, a pixel isolation pattern 321, and an insulating layer 330.

Unless otherwise stated, referring to FIG. 6, details on each of the micro lens ML, the color filter layer CF, the surface insulating layer 210, the semiconductor substrate 220, the pixel isolation pattern 221, and the insulating layer 230 may be applied equally or similarly to a micro lens ML, a color filter layer CF, a surface insulating layer 310, a semiconductor substrate 320, a pixel isolation pattern 321, and an insulating layer 330 in FIG. 8.

Referring to FIG. 7, the second gain control transistor DCX2 (2011) and the first reset transistor RX1 (2013) may be arranged to be spaced apart from each other with the floating diffusion region FD therebetween. The overflow transistor OX1 (2007) may be positioned at a first side of the first transfer transistor TX1 (2009), and the floating diffusion region FD may be positioned at a second side.

The first transfer transistor TX1 (2009) may be positioned to be spaced apart from the overflow transistor OX1 (2007) in a first direction (X direction). The first storage gate transistor SGX1 (2005) may be positioned to be spaced apart from the overflow transistor OX1 (2007) in a second direction perpendicular to the first direction (X direction). The first storage gate transistor SGX1 (2005) may be positioned vertically based on a shape of the pixel isolation pattern 321. Accordingly, an area of the first storage gate transistor SGX1 (2005) may be expanded, such that more photoelectric charges may be accumulated.

The second transistor TR3 may be positioned on the first surface SF1 of the semiconductor substrate 320. The third transistor TR3 may be the storage gate transistor SGX1 (in FIG. 4) of the image sensor 100 (in FIG. 1). The third transistor TR3 may extend from the first side SF1 of the semiconductor substrate 320 toward the second surface SF2 of the semiconductor substrate 320, and the gate insulating layer 362 may surround a sidewall and a bottom surface of the third transistor TR3. The charge storage region 365 may be positioned within the semiconductor substrate 320 below the third transistor TR3. The charge storage region 365 may have a first conductivity type.

For example, the charge storage region 365 may be positioned between the third transistor TR3 and the pixel isolation pattern 321 at a position that vertically overlaps the third transistor TR3, and may be a temporary charge storage region where photoelectric charges generated in the photoelectric conversion region 341 are temporarily stored before being transferred to the floating diffusion region FD. The charge storage region 365 may be positioned to be spaced apart from the photoelectric conversion region 341 in the first direction (X direction).

As shown in FIG. 8, a P-type barrier PB may be positioned on at least one side of the charge storage region 365. The P-type barrier PB may be positioned to be spaced apart from the charge storage region 365 and the photoelectric conversion region 241 by a certain distance. For example, each P-type barrier PB may be formed to be spaced apart from the charge storage region 365 and the photoelectric conversion device PD in the first direction (X direction) and the second direction (Y direction). Additionally, the P-type barrier PB may extend in the third direction (Z direction) along the charge storage region 365 and the photoelectric conversion region 241. For example, the P-type barrier PB may be formed vertically within the semiconductor substrate 220. The P-type barrier PB may be doped with p-type impurities.

In one or more embodiments, a storage diode 367 may be positioned at a first side of the charge storage region 365 of the third transistor TR3. In one or more embodiments, the storage diode 367 may be formed along the third direction (Z direction) on a side of the charge storage region 365 opposite to a side surface where the P-type barrier PB is positioned. Herein, the first overflow transistor OX1 may create an overflow path between the photoelectric conversion region 341 and the storage diode. To this end, the impurity implant region 345 may be positioned between the gate electrode 353 and the photoelectric conversion region 341 of the first overflow transistor OX1 and between the gate electrode 353 and the storage diode. In FIG. 8, the pixel array 300 is shown as including the storage diode 367, but embodiments are not limited thereto, and the pixel array 300 may not include the storage diode 367.

Referring to FIG. 7 together, the overflow transistor OX1 (2007) may control the transfer of photoelectric charges temporarily stored in the charge storage region 365 of the first storage gate transistor SGX1 (2005) to the floating diffusion region (2015). The overflow transistor OX1 (2007) may be positioned at a first end of the first storage gate transistor SGX1 (2005), and the switch transistor SWX1 (2017) may be positioned at a second end of the first storage gate transistor SGX1 (2005).

The first driving transistor DX1 (2003) may be connected between a conductor to which the power voltage VDD is supplied and the first selection transistor SX1 (2001). The first selection transistor SX1 (2001) may be connected to the first driving transistor DX1 (2003).

Figure 9:
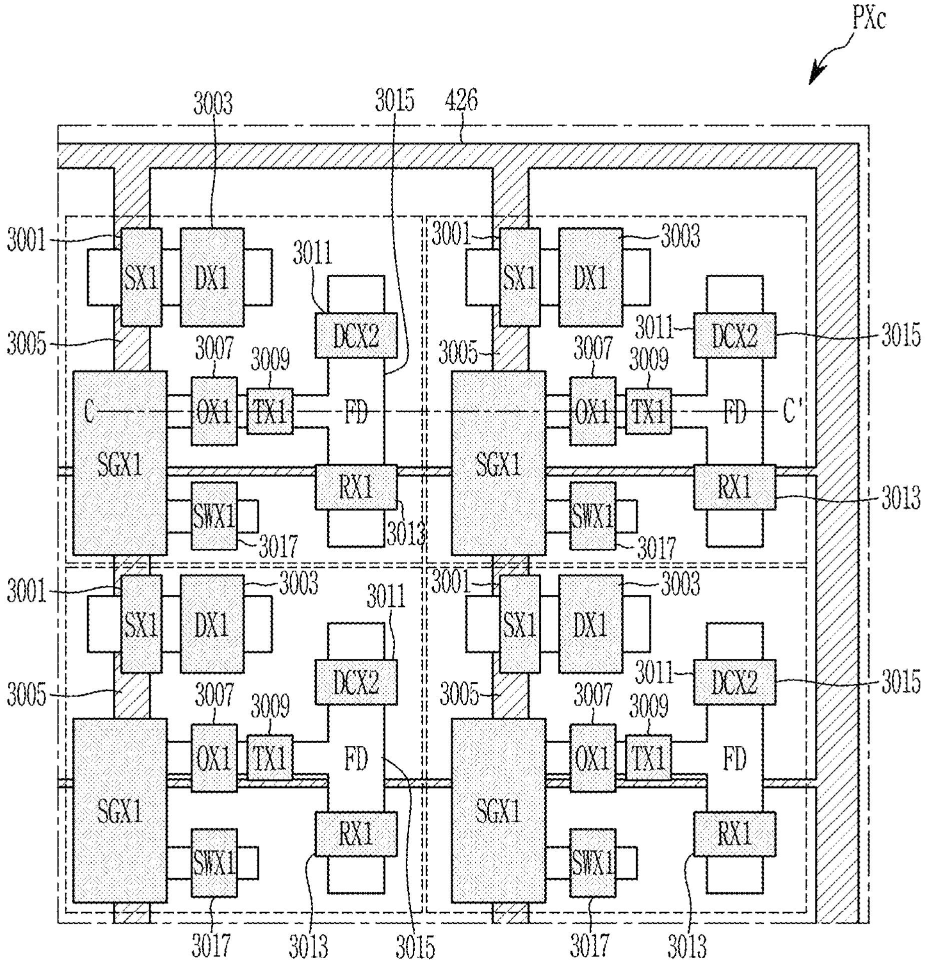
FIG. 9 illustrates a top plan view schematically showing a pixel according to one or more embodiments.
Figure 10:
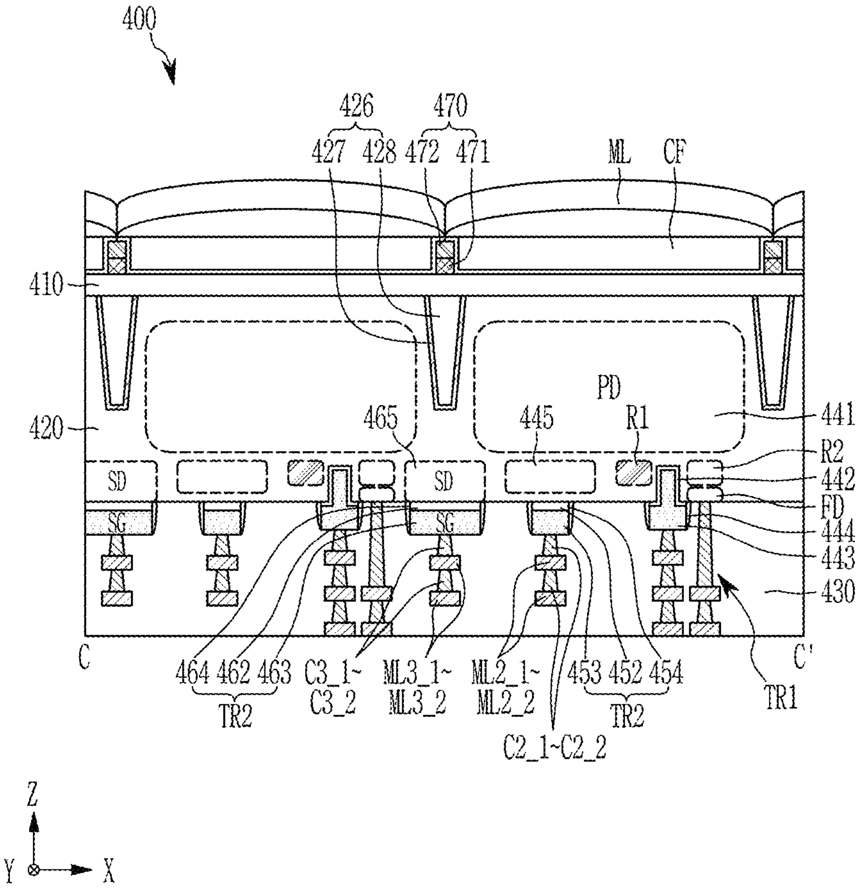
FIG. 10 illustrates schematic cross-sectional view of the pixel according to FIG. 9.

FIG. 9 illustrates a top plan view schematically showing a pixel according to one or more embodiments. FIG. 10 illustrates schematic cross-sectional view of the pixel according to FIG. 9. For example, FIG. 10 illustrates a cross-sectional view of a plurality of pixels Pxc taken along a line C-C' of FIG. 9.

Referring to FIG. 9, the pixel Pxc may include a plurality of transistors, e.g., a first transfer transistor TX1 (2009), a first reset transistor RX1 (2013), a first driving transistor DX1 (2003), a first selection transistor SX1 (2001), a first switch transistor SWX1 (2017), a first overflow transistor OX1 (2007), a storage gate transistor SGX1 (2005), and a second gain control transistor DCX2 (2011).

Unless otherwise specified, the description of the disposition of the pixel PXa described with reference to FIG. 5 may be applied in a same or similar manner to the pixel PXc.

Referring to FIGS. 9 and 10, a pixel array 400 may include a micro lens ML, a color filter layer CF, a surface insulating layer 410, a semiconductor substrate 420, a pixel isolation pattern 426, and an insulating layer 430.

Unless otherwise stated, referring to FIG. 6, details on each of the micro lens ML, the color filter layer CF, the surface insulating layer 410, the semiconductor substrate 420, and the insulating layer 430 may be applied equally or similarly to a micro lens ML, a color filter layer CF, a surface insulating layer 410, a semiconductor substrate 420, and an insulating layer 430 in FIG. 10.

The pixel isolation pattern 426 may be positioned on an outer surface of the semiconductor substrate 420 or between the pixels. The pixel isolation pattern 426 may be, e.g., an insulating material made of an oxide, a nitride, an oxynitride or a combination thereof. In one or more embodiments, the pixel isolation pattern 426 may be formed to include a conductive material layer and a cover insulating layer surrounding the conductive material layer. For example, the conductive material layer may include polysilicon, metal, or an oxide such as metal nitride or $SiO_2$, and the cover insulating layer may include an oxide, a nitride, an oxynitride, or a combination thereof.

The pixel isolation pattern 426 may be positioned within the semiconductor substrate 420. In one or more embodiments, the pixel isolation pattern 426 may include an insulating spacer layer 427 and a conductive filling pattern 428. The insulating spacer layer 427 may extend conformally along a side surface of the trench within the semiconductor substrate 420. The conductive filling pattern 428 may be formed on the insulating spacer layer 427 to fill a portion of the trench within the semiconductor substrate 420.

The pixel isolation pattern 426 may be formed from a back surface of the semiconductor substrate 420. For example, a trench is formed on the back surface of the semiconductor substrate 420, an insulating spacer layer 426 is formed in the formed trench, and a conductive filling pattern 427 is filled on the insulating spacer layer 426, thereby forming a pixel isolation pattern 426. The pixel isolation pattern 426 may not contact a front surface of the semiconductor substrate 420. Herein, the pixel isolation pattern 426 may be a backside deep trench isolation (BDTI) pattern.

The pixel isolation pattern 426 may define a plurality of unit pixels. In one or more embodiments, a plurality of unit pixels may be arranged across a plurality of pixel isolation pattern 426. For example, a plurality of transistors SX1, SGX1, SWX1, and RX1 may be disposed below the pixel isolation pattern 426.

The second transistor TR3 may be positioned on the first surface SF1 of the semiconductor substrate 420. The third transistor TR3 may be the storage gate transistor SGX1 (in FIG. 4) of the image sensor 100 (in FIG. 1). The third transistor TR3 may include a gate insulating layer 462, a gate electrode 463, a gate spacer 464, and a charge storage region 465.

The charge storage region 465 may be positioned within the semiconductor substrate 420 below the third transistor TR3. The charge storage region 465 may have a first conductivity type.

For example, the charge storage region 465 may be positioned between the first surface SF1 and the barrier impurity region at a position vertically overlapping the third transistor TR3, and may be a temporary charge storage region where photoelectric charges generated in the photoelectric conversion region 441 are temporarily stored before being transferred to the floating diffusion region FD. In one or more embodiments, the charge storage region 465 and the pixel isolation pattern 426 may be arranged to overlap each other.

In one or more embodiments, a storage diode may be formed at a lower portion of the third transistor TR3. Herein, the first overflow transistor OX1 may create an overflow path between the photoelectric conversion region 441 and the storage diode. To this end, the impurity implant region 445 may be positioned between the gate electrode 453 and the photoelectric conversion region 441 of the first overflow transistor OX1 and between the gate electrode 453 and the storage diode.

Figure 11:
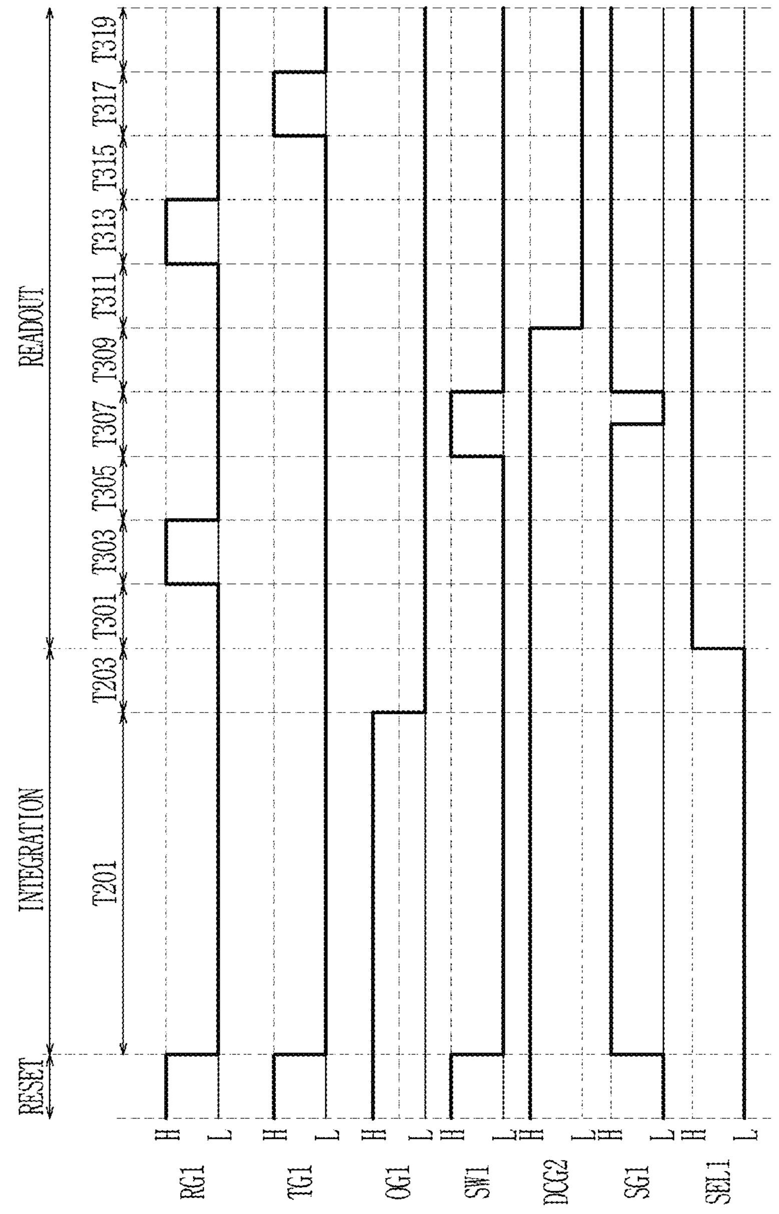
FIG. 11 illustrates a timing diagram showing an operation of an image sensor according to one or more embodiments.
Figure 12:
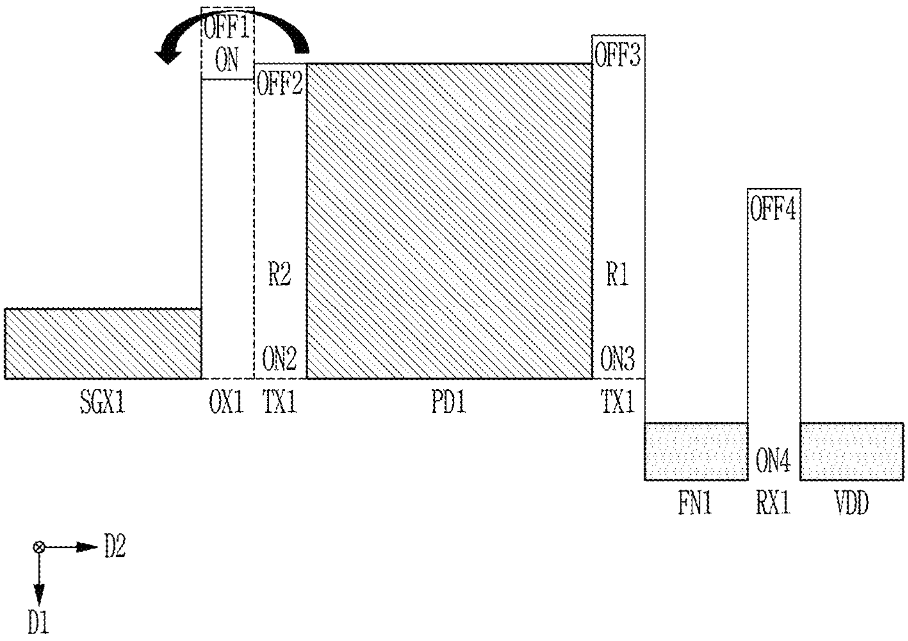
FIGS. 12 and 13 illustrate a change in potential level within a pixel.
Figure 13:
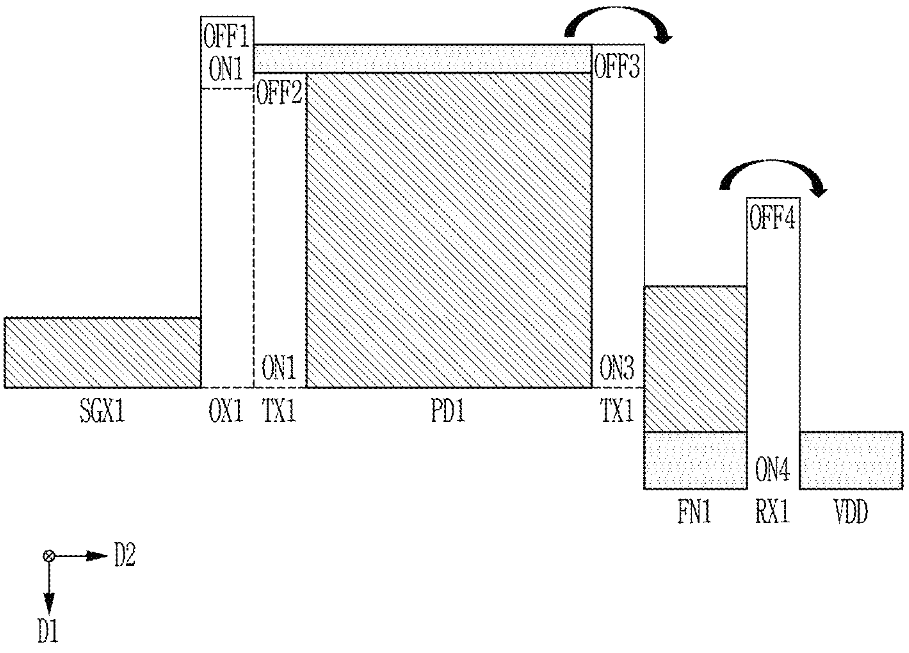

FIG. 11 illustrates a timing diagram showing an operation of an image sensor according to one or more embodiments. FIG. 12 and FIG. 13 illustrate a change in potential level within a pixel.

For example, FIG. 11 shows one scan period for driving the pixel PX3 according to FIG. 4. One scan period may sequentially include a reset period RESET, an integration period INTEGRATION, and a read-out period READOUT.

During the reset period RESET, charges stored in the first floating diffusion node FN1, the second node N12, the third node N13, and the sixth node N16 may be reset.

For example, during the reset period RESET, the reset control signal RG1, the transfer control signal TG1, the overflow control signal OG1, the switch control signal SW1, and the gain control signal DCG2 may all have a high level H. The storage control signal SG1 and the selection signal SEL1 may have a low level L. Accordingly, the first floating diffusion node FN1, the second node N12, the third node N13, and the sixth node N16 may all be reset to the power voltage VDD.

The integration period INTEGRATION is a period in which the photoelectric device PD is exposed to light and charges are generated. The integration period INTEGRATION may include a first integration period T201 and a second integration period T203.

First, the reset control signal RG1, the transfer control signal TG1, and the switch control signal SW1 may transition from the high level H to the low level L. The storage control signal SG1 may transition from the low level L to the high level H. The overflow control signal OG1 and the gain control signal DCG2 may maintain the high level H.

During the first integration period T201, the overflow control signal OG1, the gain control signal DCG2, and the storage control signal SG1 have the high level H, and the reset control signal RG1, the transfer control signal TG1, the switch control signal SW1, and the selection signal SEL1 may have the low level L.

The first integration period T201 will be described with reference to FIG. 12. FIG. 12 illustrates a potential level of each element in the pixel PX3 during the first integration period T201. A potential of each channel is expressed as a height in a direction D1. Additionally, capacitance of each channel is expressed as a width in a direction D2.

FIG. 12 illustrates potential levels of the storage gate transistor SGX1, the photoelectric device PD1, the first floating diffusion node FN1, and the power voltage VDD in the pixel PX3. Additionally, regions of the first overflow transistor OX1, the first transfer transistor TX1, and the first reset transistor RX1 are shown.

A potential level of a channel region of the first overflow transistor OX1 may vary between the first turn-on potential ON1 and the first turn-off potential OFF1 in response to a logic level of the overflow control signal OG1. In one or more embodiments, the first turn-on potential ON1 may be −0.5 V and the first turn-off potential OFF1 may be −1.8 V.

A potential level of a channel region of the second region R2 (FIG. 4) of the first transfer transistor TX1 may vary between the second turn-on potential ON2 and the second turn-off potential OFF2 in response to a logic level of the transfer control signal TG1.

A potential level of a channel region of the first region R2 (FIG. 1) of the first transfer transistor TX1 may vary between the third turn-on potential ON3 and the third turn-off potential OFF3 in response to a logic level of the transfer control signal TG1.

Herein, the second turn-off potential OFF2 and the third turn-off potential OFF3 may be changed based on a doping concentration of the first region R1 and the second region R2, respectively. For example, when the first region R1 is doped with n-type ions, the third turn-off potential OFF3 may decrease. When the second region R2 is doped with p-type ions, the second turn-off potential OFF2 may increase.

A potential level of a channel region of the first reset transistor RX1 may vary between the fourth turn-on potential ON4 and the fourth turn-off potential OFF4 in response to a logic level of the reset control signal RG1.

The first turn-on potential ON1 may have a value that is greater than the second turn-off potential OFF2, and the first turn-off potential OFF1 may have a value that is less than the second turn-off potential OFF2.

By the overflow control signal OG1 of the high level H, the overflow transistor OX1 may have the first turn-on potential ON1, and by the transfer control signal TG1 of the low level L, the second region R2 of the first transfer transistor TX1 has the second turn-off potential OFF2, and the first region R1 of the first transfer transistor TX1 may have the third turn-off potential OFF3.

Herein, photoelectric charges generated in the photoelectric device PD1 may correspond to an entire area of hatched portions. The photoelectric device PD1 may generate photoelectric charges that exceed the second turn-off potential OFF2 of the second region R2 of the transfer transistor TX1. Photoelectric charges sufficient to exceed the second turn-off potential OFF2 of the transfer transistor TX1 may cross the overflow transistor OX1 and accumulate in the storage gate transistor SGX1. However, since the third turn-off potential OFF3 has a smaller value than the second turn-off potential OFF2, the photoelectric charges generated in the photoelectric device PD1 may not flow to the first floating diffusion node FN1.

A total area of parts filled in regions of the first floating diffusion node FN1 and the power supply voltage VDD may represent an amount of charge corresponding to kTC noise that randomly occurs during the reset period RESET. However, embodiments are not limited thereto, and for example, as will be described later, photoelectric charges exceeding capacity of the storage gate transistor SGX1 may overflow from the storage gate transistor SGX1 and accumulate in the first floating diffusion node FN1.

Referring to FIG. 11 again, after the first integration period T201, the overflow control signal OG1 may transition from the high level H to the low level L.

During the second integration period T203, the gain control signal DCG2, and the storage control signal SG1 have the high level H, and the overflow control signal OG1, the reset control signal RG1, the transfer control signal TG1, the switch control signal SW1, and the selection signal SEL1 may have the low level L.

Referring to FIG. 13, by the overflow control signal OG1 of the low level L, the overflow transistor OX1 may have the first turn-off potential OFF1, and by the transfer control signal TG1 of the low level L, the second region R2 of the first transfer transistor TX1 has the second turn-off potential OFF2, and the first region R1 of the first transfer transistor TX1 may have the third turn-off potential OFF3.

The photoelectric device PD1 may generate photoelectric charges that exceed the third turn-off potential OFF3 of the first region R1 of the transfer transistor TX1. Photoelectric charges sufficient to exceed the third turn-off potential OFF3 of the transfer transistor TX1 may be accumulated in the first floating diffusion node FN1. The first turn-off potential OFF1 has a smaller value than the third turn-off potential OFF3, and thus the photoelectric charges generated in the photoelectric device PD1 may not flow to the storage gate transistor SGX1.

In one or more embodiments, based on a ratio between the first integration section T201 and the second integration section T203, a ratio of an amount of charges transferred to the storage gate transistor SGX1 and an amount of charges transferred to the first floating diffusion node FN1 may be controlled.

Accordingly, an operation of the overflow transistor OX1 may be controlled through the overflow control signal OG1 such that the charges generated in the photoelectric device PD may be properly transferred to the storage gate transistor SGX1 or the first floating diffusion node FN1.

Referring again to FIG. 11, the read-out period READOUT is a period in which the pixel signal VOUT generated in the pixel PX3 is transferred to the read-out circuit 150 (in FIG. 1). One lead-out period READOUT may include a first lead-out period T301, a second lead-out period T303, a third lead-out period T305, a fourth lead-out period T307, a fifth lead-out period T309, a sixth lead-out period T311, a seventh lead-out period T313, an eighth lead-out period T315, a ninth lead-out period T317, and a tenth lead-out period T319.

During the read-out period READOUT, the selection control signal SEL1 may transition from the low level L to the high level H. As the selection control signal SEL1 maintains the high level H, the pixel PX3 may read the pixel signal VOUT.

During the first read-out period T301, the pixel PX3 may output a signal corresponding to the charges accumulated in the first floating diffusion node FN1 as the pixel signal VOUT.

During the first lead-out period T301, the gain control signal DCG2, and the storage control signal SG1 have the high level H, and the overflow control signal OG1, the reset control signal RG1, the transfer control signal TG1, and the switch control signal SW1 may have the low level L. The pixel PX3 may operate in a LCG mode by the gain control signal DCG2 of the high level H.

Thereafter, the reset control signal RG1 may transition from the low level L to the high level H.

The second read-out period T303 may be a period for resetting the charges accumulated in the first floating diffusion node FN1.

During the second lead-out period T303, the reset control signal RG1, the gain control signal DCG2, and the storage control signal SG1 have the high level H, and the overflow control signal OG1, the transfer control signal TG1, and the switch control signal SW1 may have the low level L.

During the third read-out period T305, the pixel PX3 may output a signal corresponding to the charges of the reset first floating diffusion node FN1 as the pixel signal VOUT. Herein, the pixel PX3 may operate in a LCG mode by the gain control signal DCG2 of the high level H.

The fourth read-out period T307 may be a period in which charges accumulated in the storage gate transistor SGX1 are transferred to the first floating diffusion node FN1.

For example, the switch control signal SW1 may transition from the low level L to the high level H. While the switch control signal SW1 maintains the high level H, the storage control signal SG1 may transition from the high level H to the low level L. Accordingly, all photoelectric charges accumulated in the storage gate transistor SGX1 may be transferred to the first floating diffusion node FN1. Thereafter, the switch control signal SW1 may transition from the high level H to the low level L, and the storage control signal SG1 may transition from the low level L to the high level H.

During the fifth read-out period T309, the pixel PX3 may output a signal corresponding to the charges of the first floating diffusion node FN1 as the pixel signal VOUT. Herein, charges received from the storage gate transistor SGX1 may be accumulated in the first floating diffusion node FN1. The pixel PX3 may operate in a LCG mode by the gain control signal DCG2 of the high level H.

During the sixth read-out period T311, the gain control signal DCG2 may transition from the low level L to the high level H.

The seventh read-out period T313 may be a period for resetting the charges accumulated in the first floating diffusion node FN1.

During the seventh lead-out period T313, the reset control signal RG1, and the storage control signal SG1 have the high level H, and the overflow control signal OG1, the transfer control signal TG1, the switch control signal SW1, and the gain control signal DCG2 may have the low level L.

During the eighth read-out period T315, the pixel PX3 may output a signal corresponding to the charges of the reset first floating diffusion node FN1 as the pixel signal VOUT. Herein, the pixel PX3 may operate in an HCG mode by the gain control signal DCG2 of the low level H.

The ninth read-out period T317 may be a period in which charges accumulated in the photoelectric device PD1 are transferred to the first floating diffusion node FN1.

For example, the transfer control signal TG1 may transition from the low level L to the high level H. During the ninth lead-out period T317, the transfer control signal TG1, and the storage control signal SG1 have the high level H, and the reset control signal RG1, the overflow control signal OG1, the switch control signal SW1, and the gain control signal DCG2 may have the low level L.

During the tenth read-out period T319, the pixel PX3 may output a signal corresponding to the charges of the first floating diffusion node FN1 as the pixel signal VOUT. Herein, charges received from the photoelectric device PD1 may be accumulated in the first floating diffusion node FN1. The pixel PX3 may operate in an HCG mode by the gain control signal DCG2 of the low level H.

FIG. 11 illustrates an operation including the fourth read-out period T307, but embodiments are not limited thereto, and various methods may be used to transfer the charges accumulated in the storage gate transistor SGX1 to the first floating diffusion node FN1.

Additionally, although it has been described in FIG. 11 that a plurality of transistors are enabled when a signal of the high level H is applied, embodiments are not limited thereto, and any transistor may be enabled when a signal of the low level L is applied.

The image sensor (100 in FIG. 1) including the pixel PX3 may sense an image signal using photoelectric charges generated by one photoelectric device PD1. For example, in a relatively low-light environment with a relatively small amount of incident light, photoelectric charges may be stored in one floating diffusion node (the first floating diffusion node FN1 in FIG. 4). In a relatively high-intensity environment with a relatively large amount of incident light, photoelectric charges may be divided and stored at a certain ratio in the photoelectric device PD1, the storage gate transistor SGX1, and the second capacitor C2. Accordingly, the image sensor 100 including the pixel PX3 may sense an image signal even in the relatively high-intensity environment, thereby securing a relatively wide dynamic range.

In FIG. 11, magnitudes of all control signals TG1, RG1, SEL1, SW1, OG1, and SG1 of the high level H are shown to be the same, but embodiments are not limited thereto, and intensity of each of the signals may be set differently depending on each of the transistors.

Figure 14:
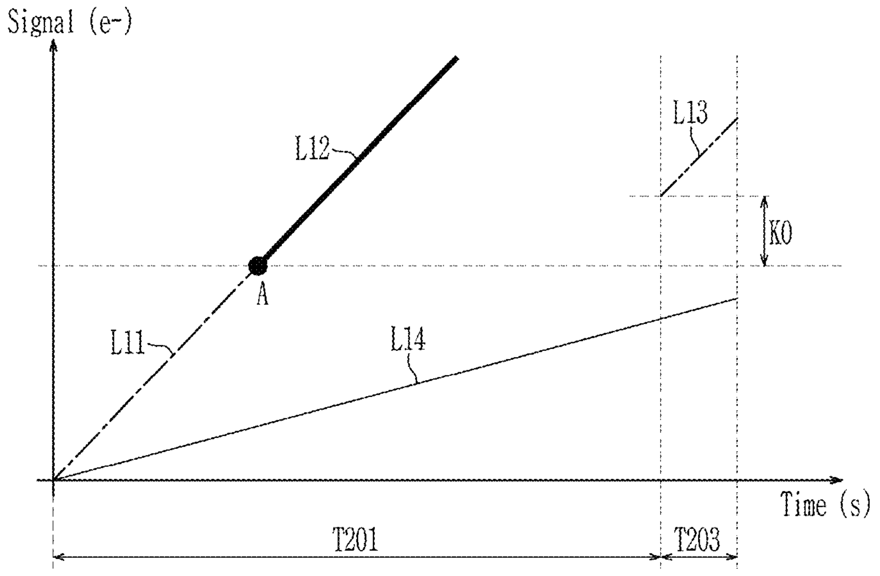
FIG. 14 illustrates a graph showing an amount of charge over time for the operation of the image sensor in FIG. 11.

FIG. 14 illustrates a graph showing an amount of charge over time for the operation of the image sensor in FIG. 11.

During the first integration period T201 in a relatively high-intensity environment, photoelectric charges may be accumulated according to a first graph L11 and a second graph L12.

For example, the first graph L11 may represent charges accumulated in the photoelectric device PD1. Herein, a point A may be a point indicating maximum capacity of photoelectric charges that can be accumulated in the photoelectric device PD1. The second graph L12 may represent charges accumulated in the storage gate transistor SGX1. For example, from a point where photoelectric charges generated in the photoelectric device PD1 exceed capacity of photoelectric charges that can be accumulated in the photoelectric device PD1, the photoelectric charges may overflow and be accumulated in the storage gate transistor SGX1. Thereafter, photoelectric charges may be accumulated as much as the capacity of the charges which can be accumulated in the storage gate transistor SGX1.

During the second integration period T203 in a relatively high-intensity environment, photoelectric charges may be accumulated according to a third graph L13.

For example, the third graph L13 may represent charges accumulated in the first floating diffusion node FN1. In this case, a first value KO may represent an amount of photoelectric charges overflowing from the storage gate transistor SGX1. For example, the third graph L12 may represent the photoelectric charges generated in the photoelectric device PD1 and transferred to the first floating diffusion node FN1 in addition to the photoelectric charges having the first value KO.

In a relatively low-light environment, photoelectric charges may be accumulated according to the fourth graph L14 during the first integration period T201 and the second integration period T203.

For example, the fourth graph L14 may be a graph showing the charges environment.

Figure 15:
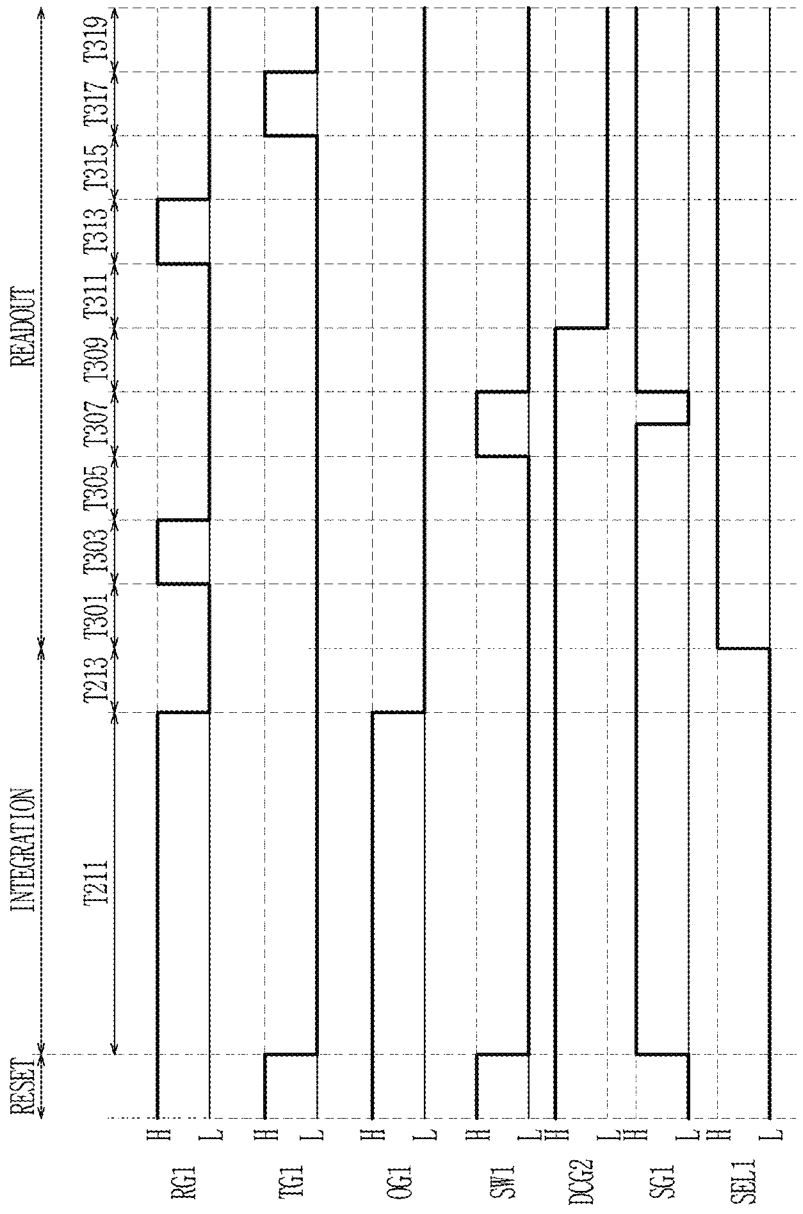
FIG. 15 illustrates a timing diagram showing an operation of an image sensor according to one or more embodiments.

FIG. 15 illustrates a timing diagram showing an operation of an image sensor according to one or more embodiments.

For example, FIG. 15 shows one scan period for driving the pixel PX3 according to FIG. 4. One scan period may sequentially include a reset period RESET, an integration period INTEGRATION, and a read-out period READOUT. Descriptions of parts that duplicate the description of the reset period RESET, the integration period INTEGRATION, and the read-out period READOUT described with reference to FIG. 11 may be omitted.

The integration period INTEGRATION is a period in which the photoelectric device PD is exposed to light and charges are generated. The integration period INTEGRATION may include a first integration period T211 and a second integration period T213.

During the first integration period T211, the reset control signal RG1, the overflow control signal OG1, the gain control signal DCG2, and the storage control signal SG1 have the high level H, and the transfer control signal TG1, the switch control signal SW1, and the selection signal SEL1 may have the low level L.

The first reset transistor RX1 may be turned on by the reset control signal RG1 of a high level H, such that the power voltage VDD may be applied to the first floating diffusion node FN1 to reset the first floating diffusion node FN1.

During the first integration period T211, when photoelectric charges sufficient to exceed a turn-off potential of the transfer transistor TX1 are generated in the photoelectric device PD1, photoelectric charges exceeding the turn-off potential of the transfer transistor TX1 may cross the overflow transistor OX1 and accumulate in the storage gate transistor SGX1. Thereafter, when photoelectric charges sufficient to exceed the capacity of the storage gate transistor SGX1 are generated in the photoelectric device PD1, excess photoelectric charges from the storage gate transistor SGX1 may overflow and accumulate in the first floating diffusion node FN1. The photoelectric charges accumulated in the first floating diffusion node FN1 may become a signal with high noise or may act as a signal loss. As the first floating diffusion node FN1 is connected to the power voltage VDD, the photoelectric charges that overflow from the storage gate transistor SGX1 to the first floating diffusion node FN1 may be reset to the power voltage VDD.

After the first integration period T201, the reset control signal RG1 and the overflow control signal OG1 may transition from the high level H to the low level L.

During the second integration period T213, the gain control signal DCG2, and the storage control signal SG1 have the high level H, and the overflow control signal OG1, the reset control signal RG1, the transfer control signal TG1, the switch control signal SW1, and the selection signal SEL1 may have the low level L.

Figure 16:
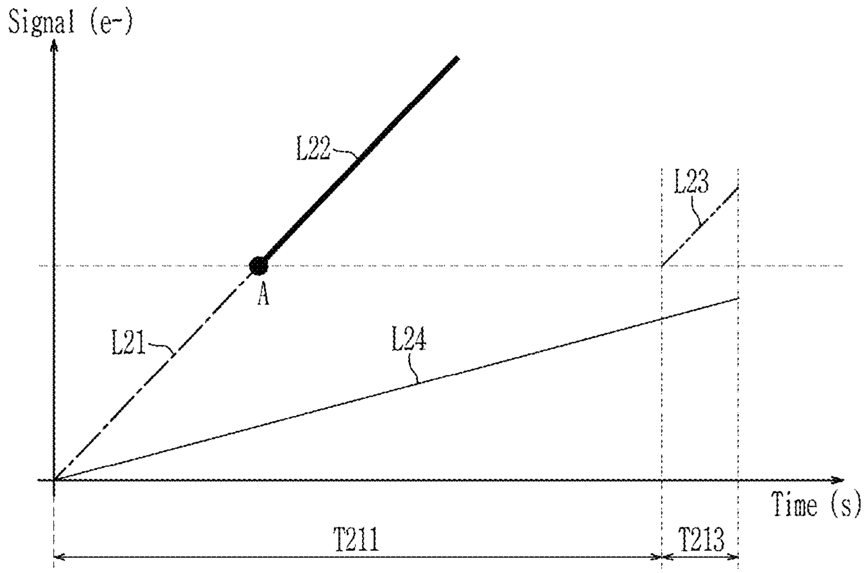
FIG. 16 illustrates a graph showing an amount of charge over time for the operation of the image sensor in FIG. 15.

FIG. 16 illustrates a graph showing an amount of charge over time for the operation of the image sensor in FIG. 15.

During the first integration period T211 in a relatively high-intensity environment, photoelectric charges may be accumulated according to a first graph L21 and a second graph L22.

For example, the first graph L21 may represent charges accumulated in the photoelectric device PD1. Herein, a point A may be a point indicating maximum capacity of photoelectric charges that can be accumulated in the photoelectric device PD1. The second graph L22 may represent charges accumulated in the storage gate transistor SGX1. For example, from a point where photoelectric charges generated in the photoelectric device PD1 exceed capacity of photoelectric charges that can be accumulated in the photoelectric device PD1, the photoelectric charges may overflow and be accumulated in the storage gate transistor SGX1. Thereafter, photoelectric charges may be accumulated as much as the capacity of the charges which can be accumulated in the storage gate transistor SGX1.

During the second integration period T213 in a relatively high-intensity environment, photoelectric charges may be accumulated according to a third graph L23.

For example, the third graph L23 may represent charges accumulated in the first floating diffusion node FN1. In this case, the photoelectric charges overflowing from the photoelectric device PD1 and the storage gate transistor SGX1 during the first integration period T211 is reset to the power voltage VDD, and thus photoelectric charges overflowing from the photoelectric device PD1 and the storage gate transistor SGX1 may be accumulated in the first floating diffusion node FN1 during the second integration period T213. Accordingly, the image sensor 100 may measure a more accurate image signal.

In a relatively low-light environment, photoelectric charges may be accumulated according to the fourth graph L24 during the first integration period T211 and the second integration period T213.

For example, the fourth graph L24 may be a graph showing the charges environment.

Figure 17:
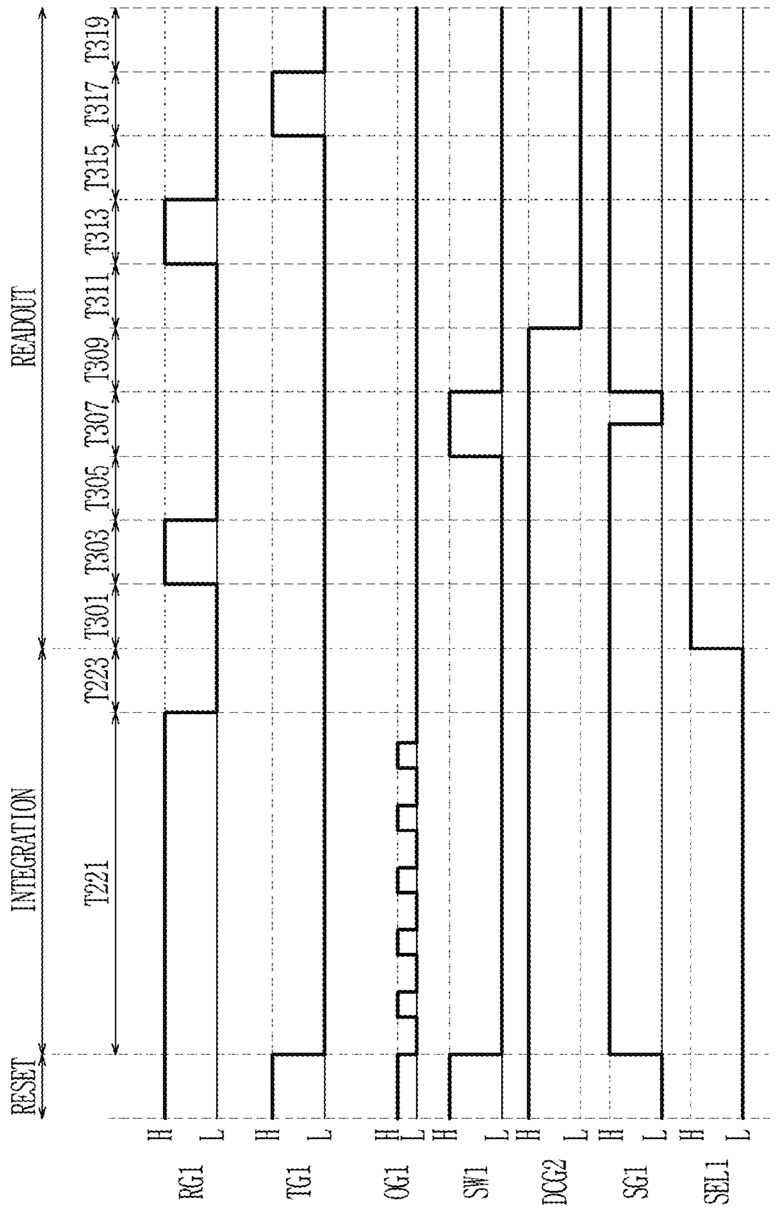
FIG. 17 illustrates a timing diagram showing an operation of an image sensor according to one or more embodiments.

FIG. 17 illustrates a timing diagram showing an operation of an image sensor according to one or more embodiments.

For example, FIG. 17 shows one scan period for driving the pixel PX3 according to FIG. 4. One scan period may sequentially include a reset period RESET, an integration period INTEGRATION, and a read-out period READOUT. Descriptions of parts that duplicate the description of the reset period RESET, the integration period INTEGRATION, and the read-out period READOUT described with reference to FIG. 15 may be omitted.

The integration period INTEGRATION is a period in which the photoelectric device PD is exposed to light and charges are generated. The integration period INTEGRATION may include a first integration period T221 and a second integration period T223.

During the first integration period T221, the reset control signal RG1, the gain control signal DCG2, and the storage control signal SG1 have the high level H, and the transfer control signal TG1, the switch control signal SW1, and the selection signal SEL1 may have the low level L. The overflow control signal OG1 may toggle with a certain period.

The row driver 130 (in FIG. 1) may control one or more of the charges generated in the photoelectric device PD1 to be transferred to the storage gate transistor SGX1 by adjusting a ratio of a period when the overflow control signal OG1 is at the high level H and a period when the overflow control signal OG1 is at the low level L. Accordingly, the row driver 130 (in FIG. 1) may achieve a similar effect to adjusting sensitivity of the pixel PX3. For example, a ratio of a period when the overflow control signal OG1 is at the high level H to a period when the overflow control signal OG1 is at the low level L may be about 10%, but embodiments are not limited thereto.

After the first integration period T221, the reset control signal RG1 may transition from the high level H to the low level L. Additionally, the overflow control signal OG1 may stop toggling and transition to the low level L.

During the second integration period T223, the gain control signal DCG2, and the storage control signal SG1 have the high level H, and the overflow control signal OG1, the reset control signal RG1, the transfer control signal TG1, the switch control signal SW1, and the selection signal SEL1 may have the low level L.

Figure 18:
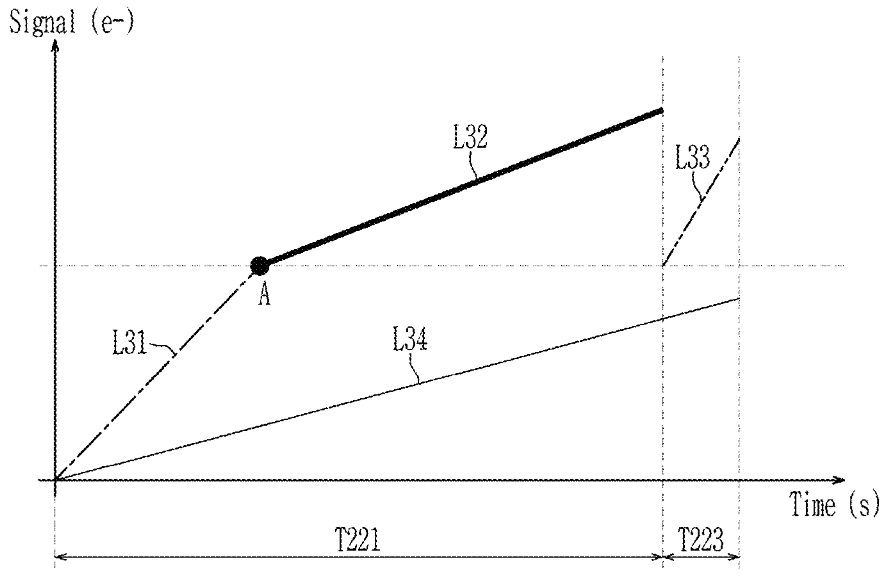
FIG. 18 illustrates a graph showing an amount of charge over time for the operation of the image sensor in FIG. 17.

FIG. 18 illustrates a graph showing an amount of charge over time for the operation of the image sensor in FIG. 17.

During the first integration period T221 in a relatively high-intensity environment, photoelectric charges may be accumulated according to a first graph L31 and a second graph L32.

For example, the first graph L31 may represent charges accumulated in the photoelectric device PD1. Herein, a point A may be a point indicating maximum capacity of photoelectric charges that can be accumulated in the photoelectric device PD1. The second graph L32 may represent charges accumulated in the storage gate transistor SGX1. For example, from a point where photoelectric charges generated in the photoelectric device PD1 exceed capacity of photoelectric charges that can be accumulated in the photoelectric device PD1, the photoelectric charges may overflow and be accumulated in the storage gate transistor SGX1. The overflow control signal OG1 toggles during the first integration period T221, and thus photoelectric charges overflowing from the photoelectric device PD1 may be alternately transferred to the first floating diffusion node FN1 and the storage gate transistor SGX1. Herein, the photoelectric charges transferred to the first floating diffusion node FN1 may be reset to the power voltage VDD.

Thereafter, photoelectric charges may be accumulated as much as the capacity of the charges which can be accumulated in the storage gate transistor SGX1. The photoelectric charges generated in excess of capacity of the storage gate transistor SGX1 cannot be accumulated in the storage gate transistor SGX1, such that an amount of photoelectric charges in that region may not be accurately measured. However, according to the operation of the image sensor according to FIG. 17, one or more of the photoelectric charges generated in the photoelectric device PD1 may be transferred to the storage gate transistor SGX1. Accordingly, a total amount of photoelectric charges may be estimated based on an amount of the photoelectric charges accumulated in the storage gate transistor SGX1.

During the second integration period T223 in a relatively high-intensity environment, photoelectric charges may be accumulated according to a third graph L33.

For example, the third graph L33 may represent charges accumulated in the first floating diffusion node FN1. The photoelectric charges overflowing from the photoelectric device PD1 and the storage gate transistor SGX1 during the first integration period T221 is reset to the power voltage VDD, and thus photoelectric charges overflowing from the photoelectric device PD1 and the storage gate transistor SGX1 may be accumulated in the first floating diffusion node FN1 during the second integration period T223. Accordingly, the image sensor 100 may measure a more accurate image signal.

In a relatively low-light environment, photoelectric charges may be accumulated according to the fourth graph L34 during the first integration period T221 and the second integration period T223.

For example, the fourth graph L34 may be a graph showing the charges accumulated in the first floating diffusion node FN1 in a relatively low-light environment.

Figure 19:
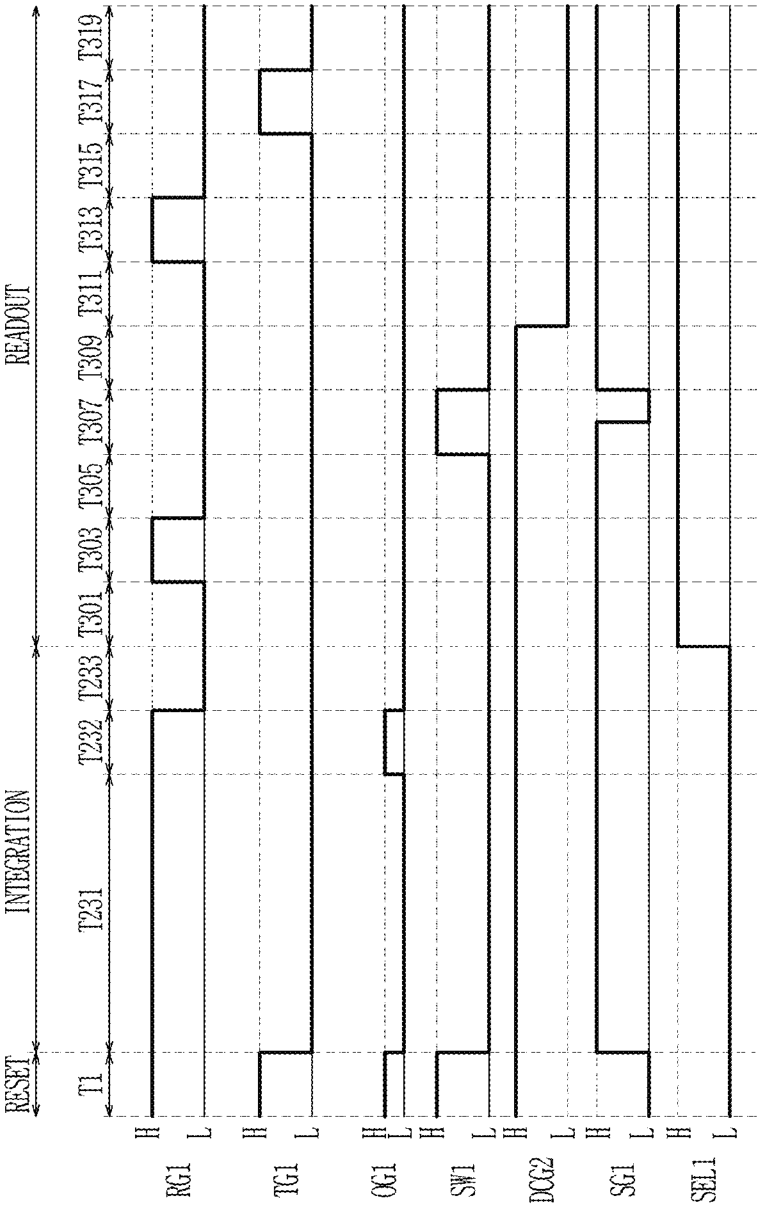
FIG. 19 illustrates a timing diagram showing an operation of an image sensor according to one or more embodiments.

FIG. 19 illustrates a timing diagram showing an operation of an image sensor according to one or more embodiments.

For example, FIG. 19 shows one scan period for driving the pixel PX3 according to FIG. 4. One scan period may sequentially include a reset period RESET, an integration period INTEGRATION, and a read-out period READOUT. Descriptions of parts that duplicate the description of the reset period RESET, the integration period INTEGRATION, and the read-out period READOUT described with reference to FIG. 15 may be omitted.

The integration period INTEGRATION is a period in which the photoelectric device PD is exposed to light and charges are generated. The integration period INTEGRATION may include a first integration period T231, a second integration period T232, and a third integration period T233.

During the first integration period T231, the reset control signal RG1, the gain control signal DCG2, and the storage control signal SG1 have the high level H, and the transfer control signal TG1, the overflow control signal OG1, the switch control signal SW1, and the selection signal SEL1 may have the low level L.

After the first integration period T231, the overflow control signal OG1 may transition from the low level L to the high level H.

During the second integration period T232, the reset control signal RG1, the overflow control signal OG1, the gain control signal DCG2, and the storage control signal SG1 have the high level H, and the transfer control signal TG1, the switch control signal SW1, and the selection signal SEL1 may have the low level L.

During the second integration period T232, when photoelectric charges sufficient to exceed a turn-off potential of the transfer transistor TX1 are generated in the photoelectric device PD1, photoelectric charges exceeding the turn-off potential of the transfer transistor TX1 may cross the overflow transistor OX1 and accumulate in the storage gate transistor SGX1. Photoelectric charges generated in the photoelectric device PD1 may be transferred to the storage gate transistor SGX1 during the second integration period T232, which is shorter than the first integration period T231. A total amount of photoelectric charges may be estimated based on an amount of the photoelectric charges accumulated in the storage gate transistor SGX1.

After the second integration period T232, the reset control signal RG1 and the overflow control signal OG1 may transition from the high level H to the low level L.

During the third integration period T233, the gain control signal DCG2, and the storage control signal SG1 have the high level H, and the overflow control signal OG1, the reset control signal RG1, the transfer control signal TG1, the switch control signal SW1, and the selection signal SEL1 may have the low level L.

The row driver 130 (in FIG. 1) may control one or more of the charges generated in the photoelectric device PD1 to be transferred to the storage gate transistor SGX1 by adjusting a ratio of a period when the overflow control signal OG1 is at the high level H and a period when the overflow control signal OG1 is at the low level L. Accordingly, the row driver 130 (in FIG. 1) may achieve a similar effect to adjusting sensitivity of the pixel PX3. For example, a ratio of a period when the overflow control signal OG1 is at the high level H to a period when the overflow control signal OG1 is at the low level L may be about 10%, but embodiments are not limited thereto.

Figure 20:
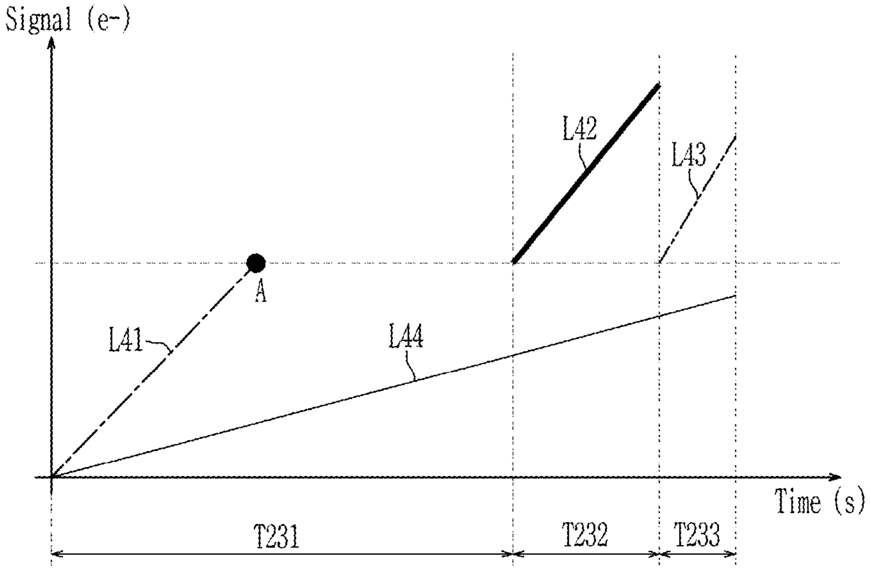
FIG. 20 illustrates a graph showing an amount of charge over time for the operation of the image sensor in FIG. 19.

FIG. 20 illustrates a graph showing an amount of charge over time for the operation of the image sensor in FIG. 19.

During the first integration period T231 in a relatively high-intensity environment, photoelectric charges may be accumulated according to a first graph L41.

For example, the first graph L21 may represent charges accumulated in the photoelectric device PD1. Herein, a point A may be a point indicating maximum capacity of photoelectric charges that can be accumulated in the photoelectric device PD1. Photoelectric charges generated in excess of a maximum amount of photoelectric charges that can be accumulated in the photoelectric element PD1 during the first integration period T231 may be reset to the power voltage VDD at the first floating diffusion node FD1.

During the second integration period T232 in a relatively high-intensity environment, photoelectric charges may be accumulated according to a second graph L42.

For example, the second graph L42 may represent charges accumulated in the storage gate transistor SGX1. Photoelectric charges are transferred to the storage gate transistor SGX1 during the second integration period T232, which is shorter than the first integration period T231, and thus photoelectric charges may be accumulated in the storage gate transistor SGX1 without exceeding the maximum capacity of the storage gate transistor SGX1. Accordingly, the image sensor 100 may measure a more accurate image signal.

During the third integration period T233 in a relatively high-intensity environment, photoelectric charges may be accumulated according to a third graph L43.

For example, the third graph L43 may represent charges accumulated in the first floating diffusion node FN1.

In a relatively low-light environment, photoelectric charges may be accumulated according to the fourth graph L44 during the first integration period T231, the second integration period T232, and the third integration period T233.

For example, the fourth graph L44 may be a graph showing the charges accumulated in the first floating diffusion node FN1 in a relatively low-light environment.

Figure 21:
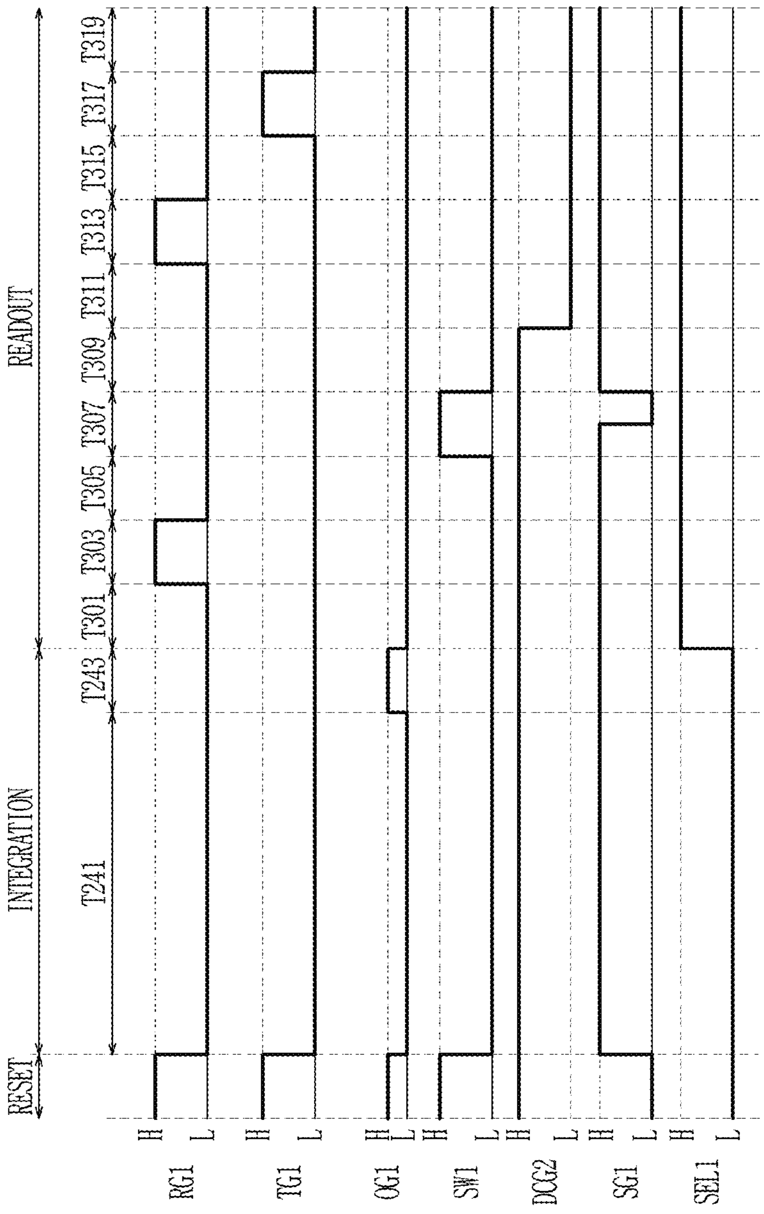
FIG. 21 illustrates a timing diagram showing an operation of an image sensor according to one or more embodiments.

FIG. 21 illustrates a timing diagram showing an operation of an image sensor according to one or more embodiments.

For example, FIG. 21 shows one scan period for driving the pixel PX3 according to FIG. 4. One scan period may sequentially include a reset period RESET, an integration period INTEGRATION, and a read-out period READOUT. Descriptions of parts that duplicate the description of the reset period RESET, the integration period INTEGRATION, and the read-out period READOUT described with reference to FIG. 19 may be omitted.

The integration period INTEGRATION is a period in which the photoelectric device PD is exposed to light and charges are generated. The integration period INTEGRATION may include a first integration period T241 and a second integration period T243.

During the first integration period T241, the gain control signal DCG2, and the storage control signal SG1 have the high level H, and the reset control signal RG1, the transfer control signal TG1, the overflow control signal OG1, the switch control signal SW1, and the selection signal SEL1 may have the low level L.

The photoelectric device PD1 may generate photoelectric charges that exceed the turn-off potential of the first region R1 of the transfer transistor TX1. Photoelectric charges sufficient to exceed the turn-off potential of the first region R1 of the transfer transistor TX1 may be accumulated in the first floating diffusion node FN1. The turn-off potential of the overflow transistor has a smaller value than the turn-off potential of the first region R1 of the first transfer transistor TX1, and thus the photoelectric charges generated in the photoelectric device PD1 may not flow to the storage gate transistor SGX1. For example, photoelectric charges generated in excess of the capacity of the photoelectric element PD1 during the first integration period T241 may be transferred to the first floating diffusion node FN1 and accumulated in the first floating diffusion node FN1.

After the first integration period T231, the overflow control signal OG1 may transition from the low level L to the high level H.

During the second integration period T243, the overflow control signal OG1, the gain control signal DCG2, and the storage control signal SG1 have the high level H, and the reset control signal RG1, the transfer control signal TG1, the switch control signal SW1, and the selection signal SEL1 may have the low level L.

During the second integration period T243, when photoelectric charges sufficient to exceed a turn-off potential of the transfer transistor TX1 are generated in the photoelectric device PD1, photoelectric charges exceeding the turn-off potential of the transfer transistor TX1 may cross the overflow transistor OX1 and accumulate in the storage gate transistor SGX1. Photoelectric charges generated in the photoelectric device PD1 may be transferred to the storage gate transistor SGX1 during the second integration period T243, which is shorter than the first integration period T241. A total amount of photoelectric charges may be estimated based on an amount of the photoelectric charges accumulated in the storage gate transistor SGX1.

The row driver 130 (in FIG. 1) may control one or more of the charges generated in the photoelectric device PD1 to be transferred to the storage gate transistor SGX1 by adjusting a ratio of a period when the overflow control signal OG1 is at the high level H and a period when the overflow control signal OG1 is at the low level L. Accordingly, the row driver 130 (in FIG. 1) may achieve a similar effect to adjusting sensitivity of the pixel PX3. For example, a ratio of a period when the overflow control signal OG1 is at the high level H to a period when the overflow control signal OG1 is at the low level L may be about 10%, but embodiments are not limited thereto.

Figure 22:
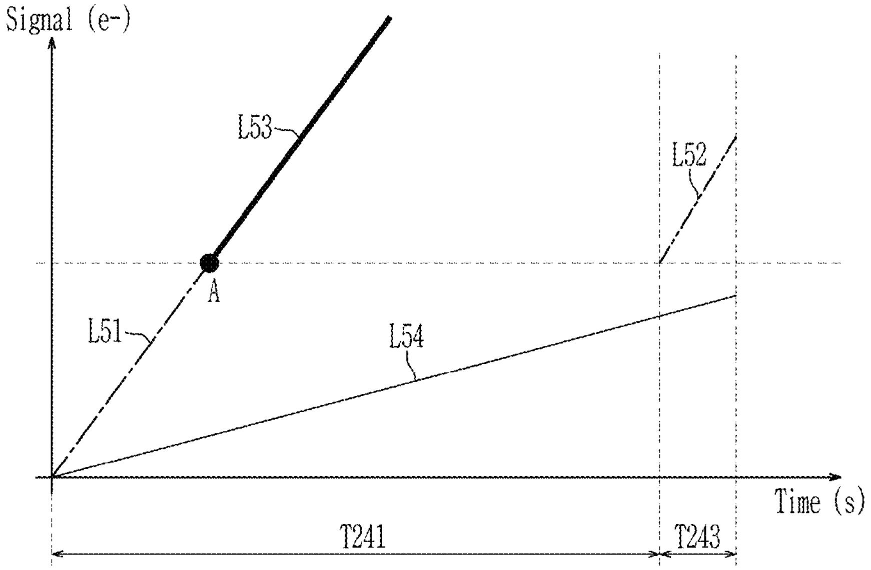
FIG. 22 illustrates a graph showing an amount of charge over time for the operation of the image sensor in FIG. 21.

FIG. 22 illustrates a graph showing an amount of charge over time for the operation of the image sensor in FIG. 21.

During the first integration period T241 in a relatively high-intensity environment, photoelectric charges may be accumulated according to a first graph L51 and a third graph L53.

For example, the first graph L51 may represent charges accumulated in the photoelectric device PD1. Herein, a point A may be a point indicating maximum capacity of photoelectric charges that can be accumulated in the photoelectric device PD1.

In addition, the third graph L53 may represent charges accumulated in the first floating diffusion node FN1.

During the second integration period T243 in a relatively high-intensity environment, photoelectric charges may be accumulated according to a second graph L52.

The second graph L52 may represent charges accumulated in the storage gate transistor SGX1. For example, photoelectric charges generated in the photoelectric element PD1 may be accumulated in the photoelectric element PD1, transferred to the first floating diffusion node FN1, and then transferred to the storage gate transistor SGX1. Photoelectric charges generated in the photoelectric device PD1 may be transferred to the storage gate transistor SGX1 during the second integration period T243, which is shorter than the first integration period T241. A total amount of photoelectric charges may be estimated based on an amount of the photoelectric charges accumulated in the storage gate transistor SGX1.

In a relatively low-light environment, photoelectric charges may be accumulated according to the fourth graph L54 during the first integration period T241 and the second integration period T243.

For example, the fourth graph L54 may be a graph showing the charges environment.

Figure 23:
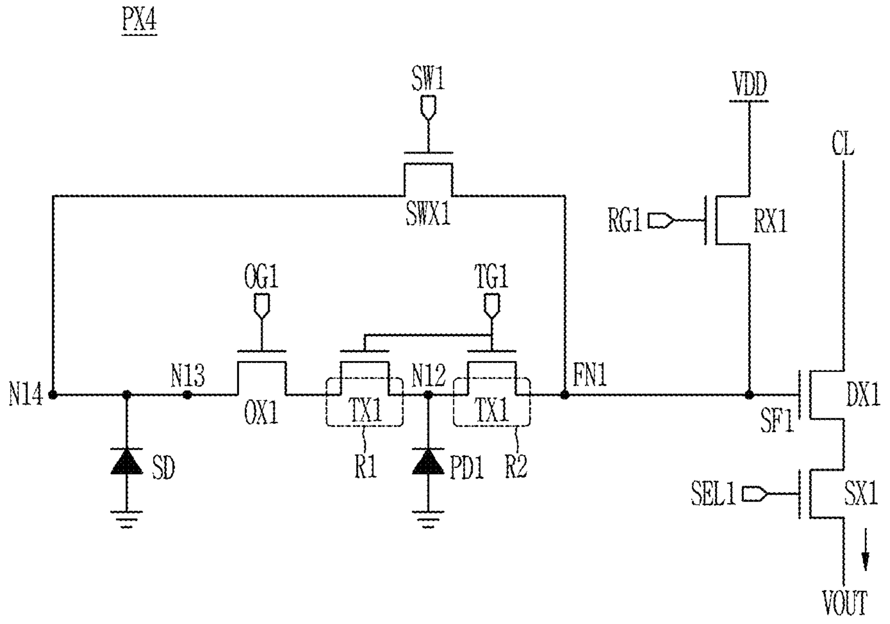
FIG. 23 illustrates a circuit diagram of a pixel according to one or more embodiments.

FIG. 23 illustrates a circuit diagram of a pixel according to one or more embodiments.

As shown in FIG. 23, a pixel PX4 may include a photoelectric device PD1 and a pixel circuit that output an electrical signal by processing the charges generated by the photoelectric device PD1.

A pixel circuit may include a plurality of transistors, e.g., a first transfer transistor TX1, a first reset transistor RX1, a first driving transistor DX1, a first selection transistor SX1, a first switch transistor SWX1, a first overflow transistor OX1, and a storage diode SD.

The storage diode SD may be a charge storage device capable of storing photoelectric charges generated by the photoelectric device PD. A cathode of the storage diode SD becomes a storage diode region. In one or more embodiments, the storage diode SD may be additionally positioned within a semiconductor substrate. In one or more embodiments, a storage gate for controlling the storage diode SD may be further positioned on the storage diode SD. In one or more embodiments, the storage diode SD may store one or more of photoelectric charges generated in the photoelectric device PD.

The storage diode SD may be implemented by doping n-type impurities into the semiconductor substrate. The storage diode SD may have a small amount of dark current that may occur when reading a pixel signal, and may enable a correlated double sampling (CDS) read-out operation. Additionally, when resetting with a power voltage, an amount of charges remaining in the storage diode SD may be small.

Figure 24:
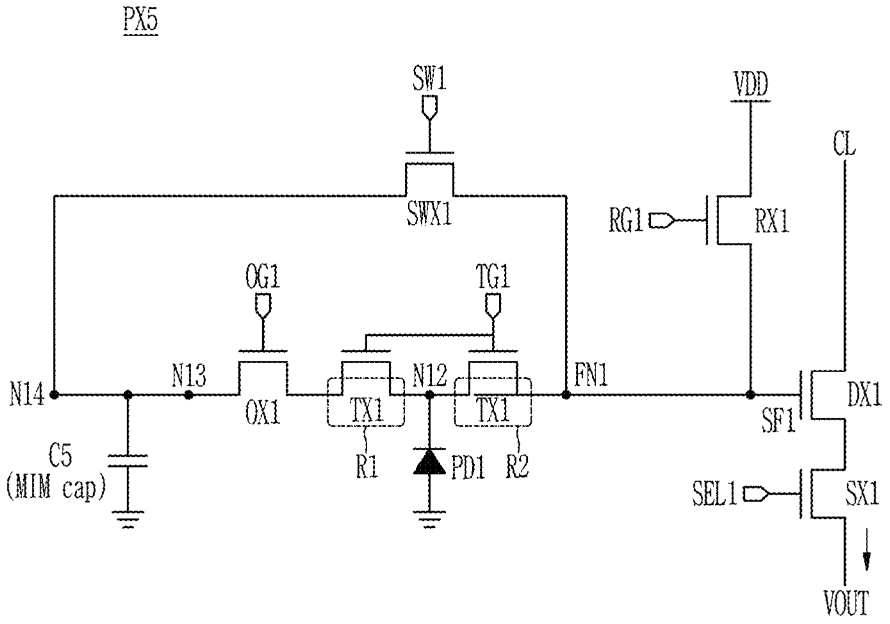
FIG. 24 illustrates a circuit diagram of a pixel according to one or more embodiments.

FIG. 24 illustrates a circuit diagram of a pixel according to one or more embodiments.

As shown in FIG. 24, a pixel PX5 may include a photoelectric device PD1 and a pixel circuit that output an electrical signal by processing the charges generated by the photoelectric device PD1.

A pixel circuit may include a plurality of transistors, e.g., a first transfer transistor TX1, a first reset transistor RX1, a first driving transistor DX1, a first selection transistor SX1, a first switch transistor SWX1, a first overflow transistor OX1, and a capacitor C5.

In one or more embodiments, the fifth capacitor C5 may include a lateral overflow integration capacitor (LOFIC). In one or more embodiments, the fifth capacitor C5 may be a metal-insulator-metal (MIM) type or cylinder type capacitor used in a DRAM.

Figure 25:
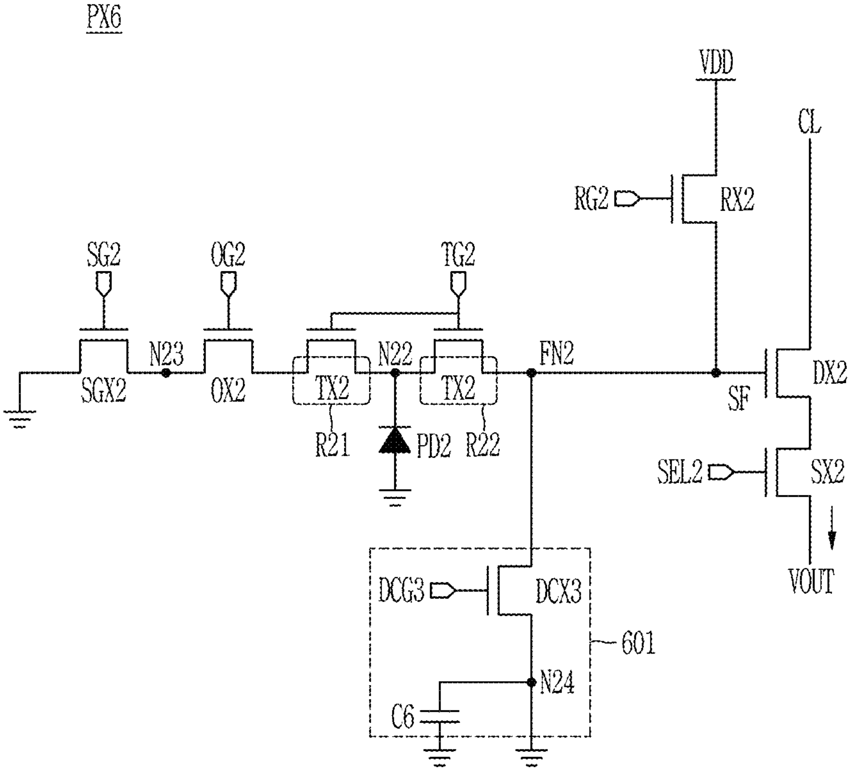
FIG. 25 illustrates a circuit diagram of a pixel according to one or more embodiments.

FIG. 25 illustrates a circuit diagram of a pixel according to one or more embodiments.

As shown in FIG. 25, a pixel PX6 may include a photoelectric device PD2 that generates charges in response to light and a pixel circuit that output an electrical signal by processing the charges generated by the photoelectric device PD2.

The photoelectric device PD2 may generate photoelectric charges that vary depending on the intensity of light. For example, a cathode of the photoelectric device PD2 may be connected to a floating diffusion node FN2 through a second transfer transistor TX2, and an anode of the photoelectric device PD2 may be grounded.

Control signals TG2, RG2, SEL2, OG2, SG2, and DCG3 may be applied to the pixel PX6. In one or more embodiments, control signals may be generated in the row driver 130 (in FIG. 1) based on control of the timing controller 120. The transistors TX2, RX2, SX2, OX2, SGX2, and DCX3 in the pixel circuit may operate in response to control signals supplied from the row driver 130, e.g., a transfer control signal TG2, a reset control signal RG2, a switch control signal SEL2, an overflow control signal OG2, and a storage control signal SG2.

The pixel circuit includes a first circuit 601 for processing photoelectric charges generated in the photoelectric device PD2, a second circuit 603 for storing the photoelectric charges, and a third circuit 605 for outputting an electrical signal.

For example, the first circuit 601 may include a plurality of transistors, e.g., a second transfer transistor TX2, a second overflow transistor OX2, and a storage gate transistor SGX2.

The second transfer transistor TX2 may be connected between the photoelectric device PD2 and the second floating diffusion node FN2. The second transfer transistor TX2 may be controlled by the transfer control signal TG2. When the second transfer transistor TX2 is turned on, the charges generated in the photoelectric device PD2 may be transferred to the first floating diffusion node FN2.

In one or more embodiments, the second transfer transistor TX2 may include a vertical transfer gate. A gate electrode of the second transfer transistor TX2 may extend along a thickness direction of a semiconductor substrate. A doping concentration at the first side and a doping concentration at the second side may be different based on the second transfer transistor TX2. For example, a first region R21 between the second transfer transistor TX2 and the overflow transistor OX2 has a first doping concentration, and a second region R22 between the second transfer transistor TX2 and the second floating diffusion node FN2 may have a second doping concentration.

In one or more embodiments, the first region R21 may be a region doped with n-type impurities. For example, the first region R21 may be doped with n-type impurities through an ion implantation process. As will be described later, photoelectric charges generated in the photoelectric device PD2 may move to the storage gate transistor SGX2 through the first region R21.

In one or more embodiments, the second region R22 may be a region doped with p-type impurities. For example, the second region R22 may be doped with p-type impurities through an ion implantation process. For example, the second region R22 may operate as a p-well region for the second transfer transistor TX2.

The second overflow transistor OX2 may be connected between the photoelectric device PD2 and a third node N23. The second overflow transistor OX2 may be controlled by the overflow control signal OG2. When the second overflow transistor OX2 is turned on, the charge generated in the photoelectric device PD2 may be transferred to the third node N23. In one or more embodiments, an amount of charges generated in the photoelectric device PD2 and transferred to the third node N23 may be controlled based on a magnitude of the overflow control signal OG2 applied to the second overflow transistor OX2.

In one or more embodiments, the second overflow transistor OX2 may be used to control the transfer of the photoelectric charges generated by the photoelectric device PD2 to the storage gate transistor SGX2. For example, the second overflow transistor OX2 may control overflow of one or more of the photoelectric charges exceeding capacity of the photoelectric device PD2 into the storage gate transistor SGX2. For example, in a relatively high-intensity environment where intensity of incident light entering the pixel PX6 is very high, the second overflow transistor OX2 may transfer one or more of the photoelectric charges overflowing from the photoelectric device PD2 to the storage gate transistor SGX2.

The storage gate transistor SGX2 may be connected between the third node N23 and a ground power. The storage gate transistor SGX2 may be controlled by the storage control signal SG2. The storage gate transistor SGX2 may be a charge storage device capable of storing photoelectric charges generated by the photoelectric device PD2. The storage gate transistor SGX2 may be controlled by the storage gate signal SG2. In one or more embodiments, an amount of charges that can be stored in the storage gate transistor SGX2 may vary based on the storage gate signal SG2. In one or more embodiments, the storage gate transistor SGX2 may have a structure that includes additional storage diodes at a lower portion thereof.

The second circuit 603 may include a dual conversion gain circuit 603. For example, the dual conversion gain circuit 603 may be connected in parallel with the second reset transistor RX2. For example, the dual conversion gain circuit 603 may include a third gain control transistor DCX3 and a sixth capacitor C6.

The third gain control transistor DCX3 may be connected between the second floating diffusion node FN2 and a fourth node N24. The third gain control transistor DCX3 may be controlled by the gain control signal DCG3. When the third gain control transistor DCX3 is turned on, the second floating diffusion node FN2 and the sixth capacitor C6 are connected, such that capacitance of the second floating diffusion node FN2 may increase, and the conversion gain, which is a rate at which charges are converted to a voltage, may decrease. For example, when the third gain control transistor DCX3 is turned on, it may operate in a low conversion gain (LCG) mode. When the third gain control transistor DCX3 is turned off, it may operate in a high conversion gain (HCG) mode.

The third circuit 605 may include a second reset transistor RX2, a second driving transistor DX2, and a second selection transistor SX2.

The second reset transistor RX2 may be connected between a power voltage line supplying a power voltage VDD and the second floating diffusion node FN2. The second reset transistor RX2 may be controlled by the reset control signal RG2. When the second reset transistor RX2 is turned on, the power voltage VDD may be applied to the second floating diffusion node FN2 to reset the second floating diffusion node FN2.

A gate of the second driving transistor DX2 may be connected to the second floating diffusion node FN2. The second driving transistor DX2 may operate as a source-follower amplifier for a voltage of the second floating diffusion node FN2. The second driving transistor DX2 may output a pixel signal VOUT to the column line CL through the second selection transistor SX2 in response to the voltage of the second floating diffusion node FN2.

The second selection transistor SX2 may be connected to a first terminal of the second driving transistor DX2 and the column line CL, to be controlled by the selection control signal SEL2. When the second selection transistor SX2 is turned on, the pixel voltage VOUT outputted from the second driving transistor DX2 may be outputted to the read-out circuit 150 (in FIG. 1) through the column line CL connected to the second selection transistor SX2.

In FIG. 25, the pixel PX6 is shown as including the dual conversion gain circuit 603 in parallel with the second reset transistor RX2, but embodiments are not limited thereto, and the pixel PX6 may include the dual conversion gain circuit 603 connected in series with the second reset transistor RX2, or may not include the dual conversion gain circuit 603.

Figure 26:
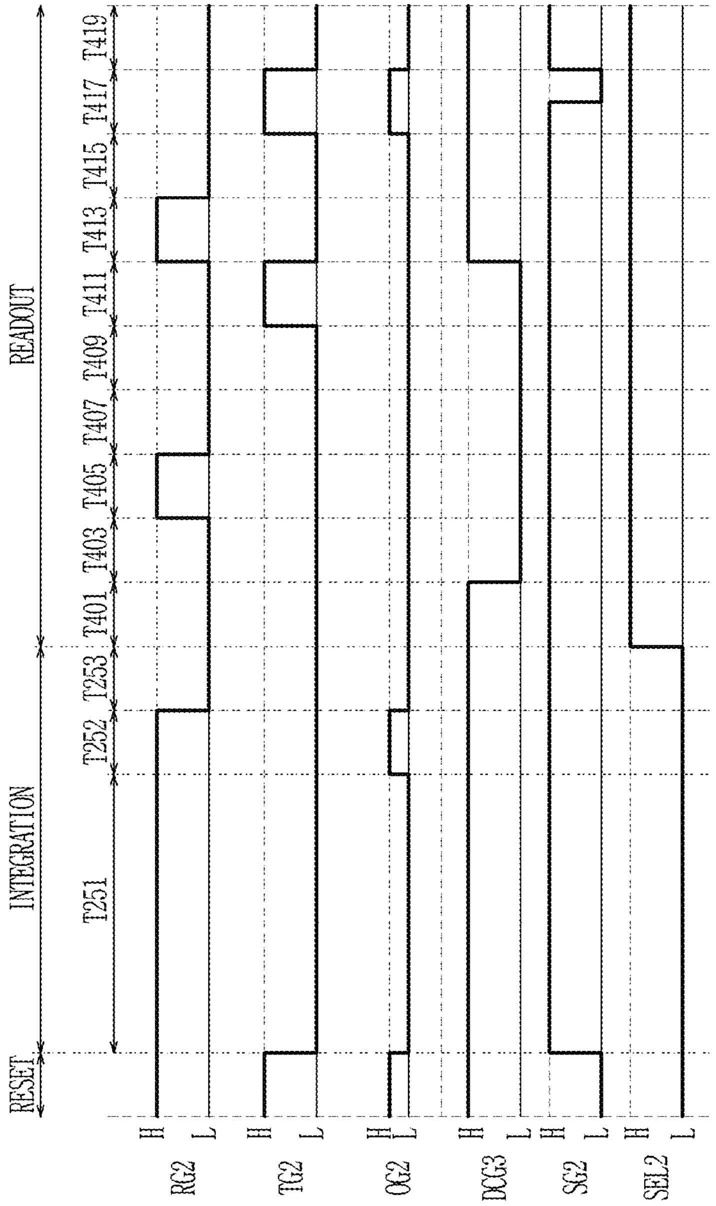
FIG. 26 illustrates a timing diagram showing an operation of an image sensor according to one or more embodiments.

FIG. 26 illustrates a timing diagram showing an operation of an image sensor according to one or more embodiments.

For example, FIG. 26 shows one scan period for driving the pixel PX6 according to FIG. 25. One scan period may sequentially include a reset period RESET, an integration period INTEGRATION, and a read-out period READOUT.

During the reset period RESET, charges stored in the second floating diffusion node FN2, the second node N22, the third node N23, and the fourth node N24 may be reset.

For example, during the reset period RESET, the reset control signal RG2, the transfer control signal TG2, the overflow control signal OG2, and the gain control signal DCG3 may all have a high level H. The storage control signal SG2 and the selection signal SEL2 may have a low level L. Accordingly, the second floating diffusion node FN2, the second node N22, the third node N23, and the fourth node N24 may all be reset to the power voltage VDD.

The integration period INTEGRATION is a period in which the photoelectric device PD2 is exposed to light and charges are generated. The integration period INTEGRATION may include a first integration period T251, a second integration period T252, and a third integration period T253.

During the first integration period T251, the reset control signal RG2, the gain control signal DCG3, and the storage control signal SG2 have the high level H, and the transfer control signal TG2, the overflow control signal OG2, and the selection signal SEL2 may have the low level L.

After the first integration period T251, the overflow control signal OG2 may transition from the low level L to the high level H.

During the second integration period T252, the reset control signal RG2, the overflow control signal OG2, the gain control signal DCG3, and the storage control signal SG2 have the high level H, and the transfer control signal TG2 and the selection signal SEL2 may have the low level L.

During the second integration period T252, when photoelectric charges sufficient to exceed a turn-off potential of the transfer transistor TX2 are generated in the photoelectric device PD2, photoelectric charges exceeding the turn-off potential of the transfer transistor TX2 may cross the overflow transistor OX2 and accumulate in the storage gate transistor SGX2. Photoelectric charges generated in the photoelectric device PD2 may be transferred to the storage gate transistor SGX2 during the second integration period T252, which is shorter than the first integration period T251. A total amount of photoelectric charges may be estimated based on an amount of the photoelectric charges accumulated in the storage gate transistor SGX2.

After the second integration period T252, the reset control signal RG2 and the overflow control signal OG2 may transition from the high level H to the low level L.

During the third integration period T253, the gain control signal DCG3, and the storage control signal SG2 have the high level H, and the overflow control signal OG2, the reset control signal RG2, the transfer control signal TG2, and the selection signal SEL2 may have the low level L.

The row driver 130 (in FIG. 1) may control one or more of the charges generated in the photoelectric device PD2 to be transferred to the storage gate transistor SGX2 by adjusting a ratio of a period when the overflow control signal OG2 is at the high level H and a period when the overflow control signal OG2 is at the low level L. Accordingly, the row driver 130 (in FIG. 1) may achieve a similar effect to adjusting sensitivity of the pixel PX6. For example, a ratio of a period when the overflow control signal OG2 is at the high level H to a period when the overflow control signal OG2 is at the low level L may be about 10%, but embodiments are not limited thereto.

The read-out period READOUT is a period in which the pixel signal VOUT generated in the pixel PX6 is transferred to the read-out circuit 150 (in FIG. 1). One lead-out period READOUT may include a first lead-out period T401, a second lead-out period T403, a third lead-out period T405, a fourth lead-out period T407, a fifth lead-out period T409, a sixth lead-out period T411, a seventh lead-out period T413, an eighth lead-out period T415, a ninth lead-out period T417, and a tenth lead-out period T419.

During the read-out period READOUT, the selection control signal SEL2 may transition from the low level L to the high level H. As the selection control signal SEL2 maintains the high level H, the pixel PX6 may read the pixel signal VOUT.

During the first read-out period T401, the pixel PX6 may output a signal corresponding to the charges accumulated in the second floating diffusion node FN2 as the pixel signal VOUT.

During the first lead-out period T401, the gain control signal DCG3, and the storage control signal SG2 have the high level H, and the overflow control signal OG2, the reset control signal RG2, and the transfer control signal TG2 may have the low level L. The pixel PX6 may operate in a LCG mode by the gain control signal DCG3 of the high level H.

During the second read-out period T403, the gain control signal DCG3 may transition from the low level L to the high level H.

The third read-out period T405 may be a period for resetting the charges accumulated in the second floating diffusion node FN2.

During the third integration period T405, the reset control signal RG2, and the storage control signal SG2 have the high level H, and the transfer control signal TG2, the overflow control signal OG2, and the gain control signal DCG3 may have the low level L.

During the fourth read-out period T407, the pixel PX6 may output a signal corresponding to the charges of the reset second floating diffusion node FN2 as the pixel signal VOUT. Herein, the pixel PX6 may operate in an HCG mode by the gain control signal DCG3 of the low level H.

The fifth read-out period T409 may be a period in which charges accumulated in the photoelectric device PD2 are transferred to the second floating diffusion node FN2.

For example, the transfer control signal TG2 may transition from the low level L to the high level H. During the ninth lead-out period T417, the transfer control signal TG2, and the storage control signal SG2 have the high level H, and the reset control signal RG2, the overflow control signal OG2, and the gain control signal DCG3 may have the low level L.

During the sixth read-out period T411, the pixel PX6 may output a signal corresponding to the charges of the second floating diffusion node FN2 as the pixel signal VOUT. Herein, charges received from the photoelectric device PD2 may be accumulated in the second floating diffusion node FN2. The pixel PX6 may operate in an HCG mode by the gain control signal DCG3 of the low level H.

The seventh read-out period T413 may be a period for resetting the charges accumulated in the second floating diffusion node FN2 and the fourth node N24.

During the seventh lead-out period T413, the reset control signal RG2, the gain control signal DCG3, and the storage control signal SG2 have the high level H, and the transfer control signal TG2, and the overflow control signal OG2 may have the low level L.

During the eighth read-out period T415, the pixel PX6 may output a signal corresponding to the charges of the reset second floating diffusion node FN2 as the pixel signal VOUT. Herein, the pixel PX6 may operate in a LCG mode by the gain control signal DCG3 of the high level H.

The ninth read-out period T417 may be a period in which charges accumulated in the storage gate transistor SGX2 are transferred to the second floating diffusion node FN2 through the second node N22.

For example, the transfer control signal TG2 and the overflow control signal OG2 may transition from the low level L to the high level H. While the transfer control signal TG2 and the overflow control signal OG2 maintain the high level H, the storage control signal SG2 may transition from the high level H to the low level L. Accordingly, all photoelectric charges accumulated in the storage gate transistor SGX2 may be transferred to the second floating diffusion node FN2. Thereafter, the transfer control signal TG2 and the overflow control signal OG2 may transition from the high level H to the low level L, and the storage control signal SG2 may transition from the low level L to the high level H.

During the tenth read-out period T419, the pixel PX6 may output a signal corresponding to the charges of the second floating diffusion node FN2 as the pixel signal VOUT. Herein, charges received from the storage gate transistor SGX2 may be accumulated in the second floating diffusion node FN2. The pixel PX6 may operate in a LCG mode by the gain control signal DCG2 of the high level H.

In FIG. 26 illustrates an operation including the ninth read-out period T417, but embodiments are not limited thereto, and various methods may be used to transfer the charges accumulated in the storage gate transistor SGX2 to the second floating diffusion node FN2.

Additionally, although it has been described in FIG. 26 that a plurality of transistors are enabled when a signal of the high level H is applied, embodiments are not limited thereto, and any transistor may be enabled when a signal of the low level L is applied.

The image sensor (100 in FIG. 1) including the pixel PX6 may sense an image signal using photoelectric charges generated by one photoelectric device PD2. For example, in a relatively low-light environment with a relatively small amount of incident light, photoelectric charges may be stored in one floating diffusion node (the second floating diffusion node FN2 in FIG. 25). In a relatively high-intensity environment with a relatively large amount of incident light, photoelectric charges may be divided and stored at a certain ratio in the photoelectric device PD2, the storage gate transistor SGX2, and the sixth capacitor C6. Accordingly, the image sensor 100 including the pixel PX6 may sense an image signal even in the relatively high-intensity environment, thereby securing a relatively wide dynamic range.

In FIG. 26, magnitudes of all control signals TG2, RG2, SEL2, OG2, and SG2 of the high level H are shown to be the same, but embodiments are not limited thereto, and intensity of each of the signals may be set differently depending on each of the transistors.

Figure 27:
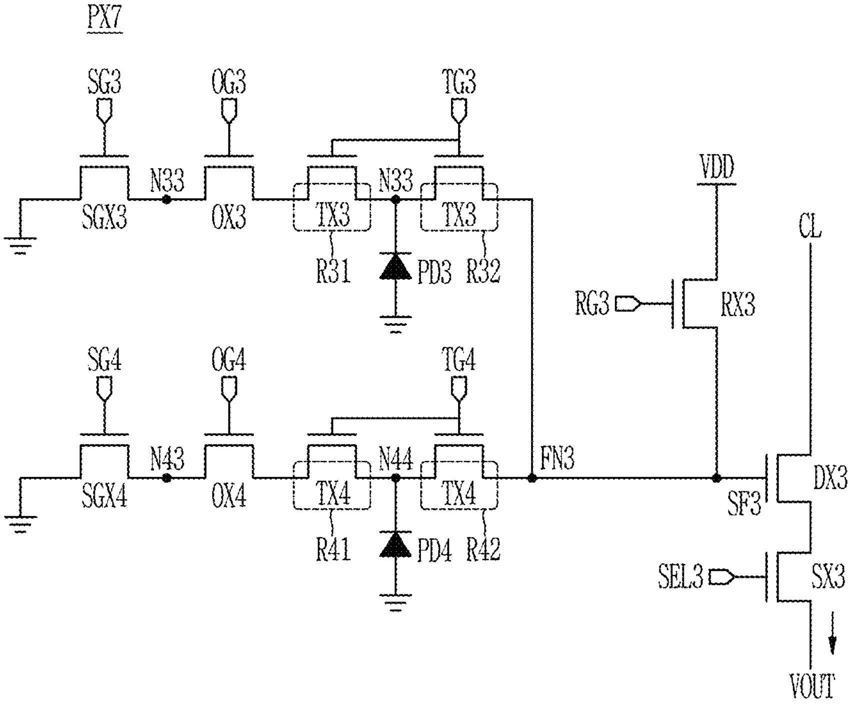
FIG. 27 illustrates a circuit diagram of a pixel according to one or more embodiments.

FIG. 27 illustrates a circuit diagram of a pixel according to one or more embodiments.

As shown in FIG. 27, a pixel PX7 may include a plurality of photoelectric devices PD3 and PD1 and a pixel circuit that output an electrical signal by processing the charges generated by each of the photoelectric devices PD3 and PD1.

Control signals TG3, TG4, RG3, SEL3, OG3, OG4, SG3, and SG4 may be applied to the pixel PX6. In one or more embodiments, control signals may be generated in the row driver 130 (in FIG. 1) based on control of the timing controller 120. The transistors TX3, TX4, RX3, SX3, OX3, OX4, SGX3, and SGX4 in the pixel circuit may operate in response to control signals supplied from the row driver 130, e.g., transfer control signals TG3 and TG4, a reset control signal RG3, a switch control signal SEL3, overflow control signals OG3 and OG4, and storage control signals SG3 and SG4.

The pixel circuit includes a first circuit 7011 for processing photoelectric charges generated in the photoelectric device PD3, a first circuit 7013 for processing photo charges generated in the photoelectric element PD4, and a third circuit 605 for outputting an electrical signal.

Unless otherwise specified, what is described about the first circuit 601 with reference to FIG. 25 may be applied equally or similarly to the first subcircuits 7011 and 7013 of FIG. 27, and a content described about the third circuit 605 with reference to FIG. 25 may be applied in a same or similar manner to the third circuit 705.

In FIG. 27, the pixel PX7 is shown as not including a dual conversion gain circuit, but embodiments are not limited thereto, and may further include a dual conversion gain circuit. In one or more embodiments, the pixel PX7 may include a dual conversion gain circuit connected in series or parallel with the third reset transistor RX3.

In FIG. 27, one pixel PX7 is shown as including two photoelectric devices PD3 and PD4, but embodiments are not limited thereto, and one pixel PX7 may include more or fewer photoelectric devices.

Figure 28:
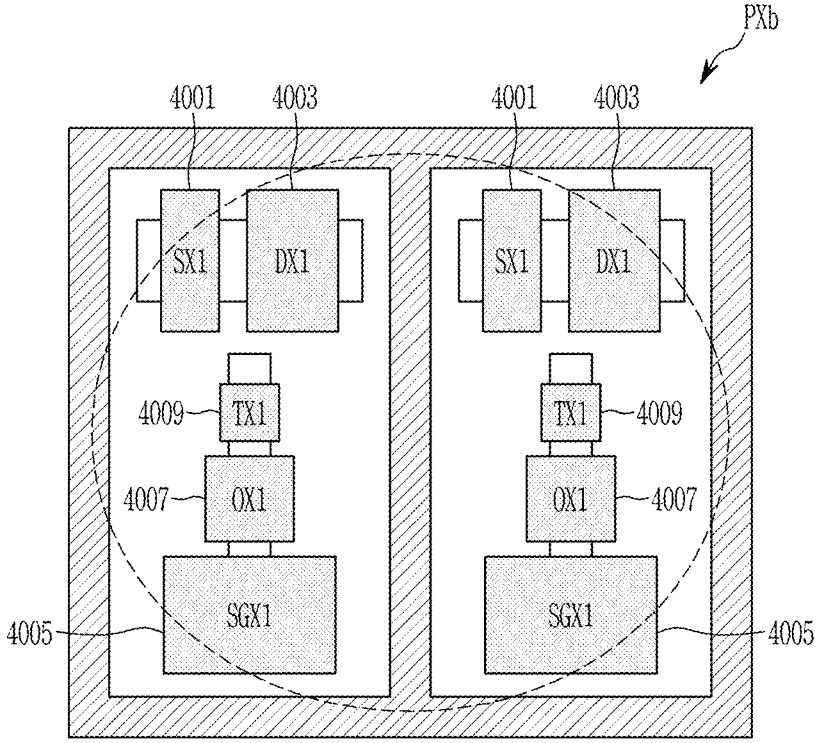
FIG. 28 illustrates schematic cross-sectional view of the pixel according to FIG. 27.

FIG. 28 illustrates schematic cross-sectional view of the pixel according to FIG. 27.

Referring to FIG. 28, the pixel PXd may include a pixel isolation pattern 221 and a plurality of transistors. The transistors may include, e.g., a third transfer transistor TX3 (4009), a fourth transfer transistor TX4 (4019), a third overflow transistor OX3 (4007), a fourth overflow transistor OX4 (4017), a storage gate transistor SGX3 (4005), a storage gate transistor SGX4 (4015), a third selection transistor SX3 (4001), and a driving transistor DX3 (4003).

The pixel PXd may include two photoelectric devices under one micro lens ML4. In FIG. 28, the pixel PXd is shown as including two photoelectric devices, but embodiments are not limited thereto, and the pixel PXd may include three or more photoelectric devices. Accordingly, an image signal may be sensed using at least one photoelectric device in a relatively high-intensity environment with a large amount of light incident on the pixel PXd.

Figure 29:
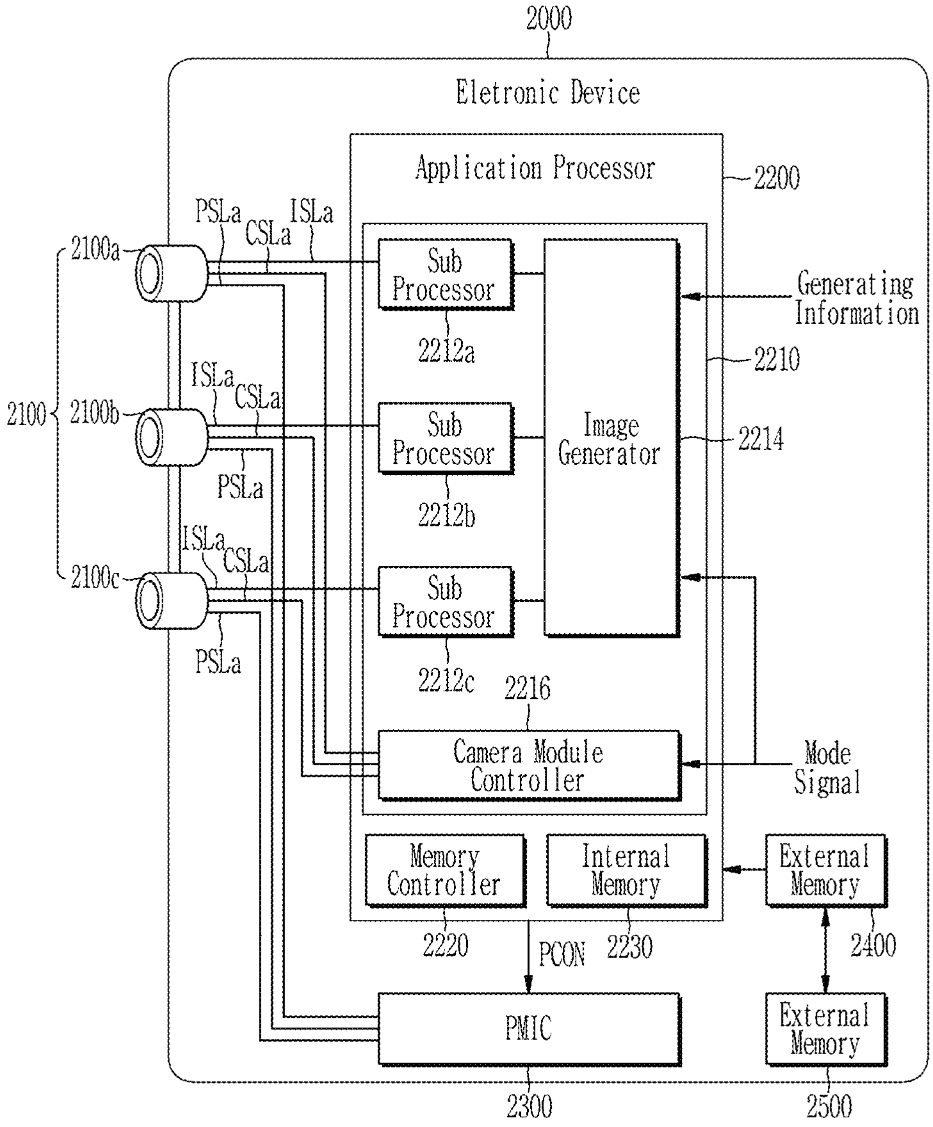
FIG. 29 illustrates a block diagram showing an electronic device according to one or more embodiments.
Figure 30:
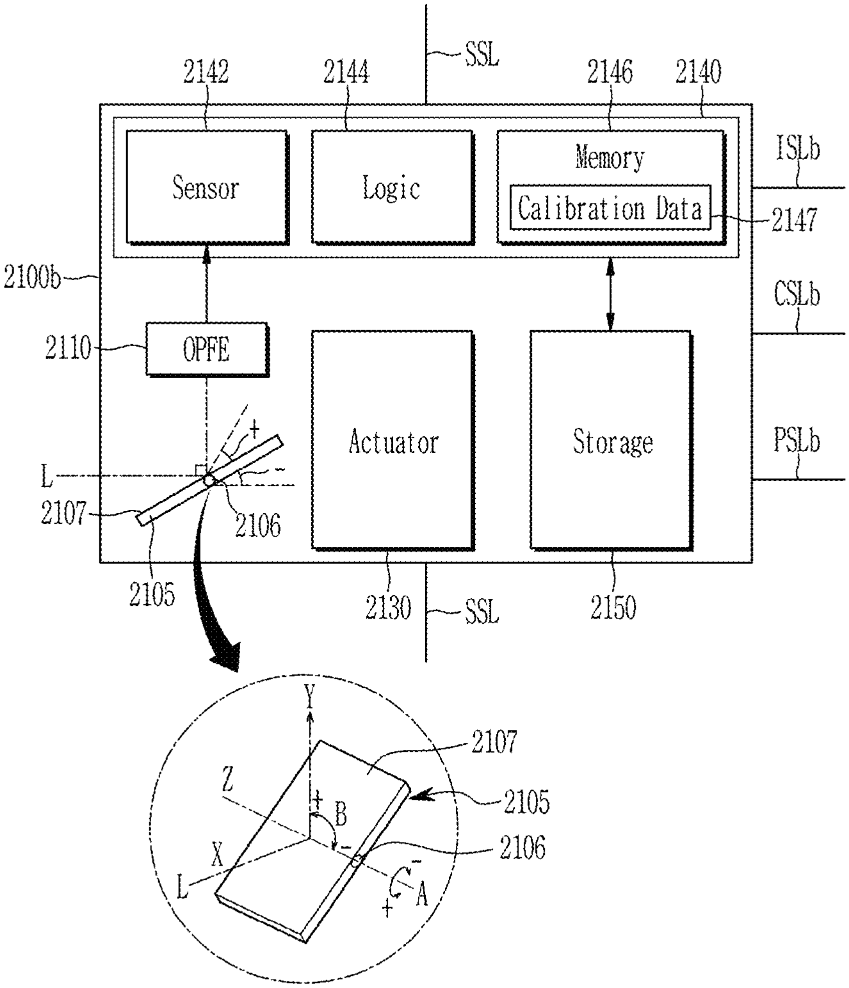
FIG. 30 illustrates a detailed block diagram of a camera module according to FIG. 29.

FIG. 29 illustrates a block diagram showing an electronic device according to one or more embodiments. FIG. 30 illustrates a detailed block diagram of a camera module according to FIG. 29.

Referring to FIG. 29, the electronic device 2000 may include a camera module group 2100, an application processor 2200, a PMIC 2300, an external memory 2400, and a display 2500.

In one or more embodiments, the electronic device 2000 may be mounted on a mobile device, a surveillance camera, a vehicle, etc.

The camera module group 2100 may include a plurality of camera modules 2100*a*, 2100*b*, and 2100*c*. In FIG. 29, the camera module group 2100 is shown as including three camera modules 2100*a*, 2100*b*, and 2100*c*, but embodiments are not limited thereto, and the camera module group 2100 may include at least one camera module.

In one or more embodiments, the three camera modules 2100*a*, 2100*b*, and 2100*c* may be camera modules including the image sensor 100 described using FIGS. 1 to 28.

Referring to FIG. 30, the camera module 2100*b* will be described. A following description may be applied equally or similarly to other camera modules 2100*a* and 2100*c* according to one or more embodiments.

As shown in FIG. 30, the camera module 2100*b* includes a prism 2105, an optical path folding element (hereinafter referred to as "OPFE") 2110, an actuator 2130, and an image sensing device 2140, and a storage 2150.

The prism 2105 may include a reflective surface 2107 of a light-reflecting material to change a path of light L incident from the outside.

In one or more embodiments, the prism 2105 may change the path of light L incident in a first direction (X direction) to a second direction (Y direction) perpendicular to the first direction (X direction). In addition, the prism 2105 rotates the reflective surface 2107 of the light-reflecting material in a direction A about a central axis 2106, to rotate the central axis 2106 in a direction B to change the path of light L incident in the first direction (X direction) to the second direction (Y direction) perpendicular thereto. In this case, the OPFE 2110 may also move in a third direction (Z direction) perpendicular to the first direction (X direction) and the second direction (Y direction).

In one or more embodiments, the prism 2105 may move the reflective surface 2106 of the light-reflecting material in the third direction (e.g., Z direction) parallel to a direction of extension of the central axis 2106.

The OPFE 2110 may include, e.g., an optical lens including m groups (where m is a natural number). The m lenses may change an optical zoom ratio of the camera module 2100*b* by moving in the second direction (Y direction). For example, assuming that a basic optical zoom magnification of the camera module 2100*b* is Z, when moving the m optical lenses included in OPFE 2110, the optical zoom magnification of the camera module 2100*b* may be changed to an optical zoom magnification of 3Z or 5Z or higher.

The actuator 2130 may move the OPFE 2110 or an optical lens (hereinafter referred to as an optical lens) to a specific position. For example, the actuator 2130 may adjust a position of the optical lens such that an image sensor 2142 is positioned at a focal length of the optical lens for accurate sensing.

The image sensing device 2140 may include an image sensor 2142, a control logic 2144, and a memory 2146. The image sensor 2142 may sense an image of a sensing object using the light L provided through an optical lens. In one or more embodiments, the image sensor 2142 may include the image sensor 100 described with reference to FIGS. 1 through 28.

For example, the image sensor may include a transfer transistor including a vertical transfer gate whose a first side and a second side have different potentials. For example, the first side and the second side may have different doping concentrations based on a gate electrode of the transfer transistor. For example, the first side and the second side of the transfer transistor may have different oxide thicknesses based on the gate electrode thereof. The image sensor may include a charge storage for storing photoelectric charges generated in the photoelectric device and an overflow transistor between the charge storage and the transfer transistor. Herein, the overflow transistor may have a potential level between a first level that is higher than a potential level of the first side of the transfer transistor and a second level that is lower than a potential level of the second side of the transfer transistor. The image sensor may control the overflow transistor to transfer photoelectric charges to the floating diffusion node during a first period of the integration period, and may transfer the photoelectric charges to the charge storage during a second period of the integration period. Accordingly, the image sensor may sense an accurate image signal even in a high-light environment by controlling one transistor.

The control logic 2144 may control an overall operation of the camera module 2100*b*. For example, the control logic 2144 may control the operation of the camera module 2100*b* according to a control signal provided through a control signal line CSLb.

The memory 2146 may store information necessary for the operation of the camera module 2100*b*, such as calibration data 2147. The calibration data 2147 may include information necessary for the camera module 2100*b* to generate image data using the light L provided from the outside. The calibration data 2147 may include, e.g., information related to a degree of rotation described above, information related to a focal length, and information related to an optical axis. When the camera module 2100*b* is implemented as a multi-state camera whose focal length changes depending on a position of an optical lens, the calibration data 2147 may include information related to the focal length and auto focusing for each position (or state) of the optical lens. Herein, the memory 2146 may include a variable resistance element VR1 described above. For example, memory 2146 may include a memory cell MC including the variable resistor element VR1.

The storage 2150 may store image data sensed through the image sensor 2142. The storage 2150 may be positioned outside the image sensing device 2140, and may be implemented in a stacked form with a sensor chip constituting the image sensing device 2140. In one or more embodiments, the storage 2150 may be implemented as an electrically erasable programmable read-only memory (EEPROM), but embodiments are not limited thereto. The storage 2150 may be implemented by a lower chip 300. The storage 2150 may include the memory cell MC including the variable resistor element VR1 described above.

Referring to FIGS. 29 and 30 together, in one or more embodiments, each of the camera modules 2100*a*, 2100*b*, and 2100*c* may include an actuator 2130. Accordingly, each of the camera modules 2100*a*, 2100*b*, and 2100*c* may include the same or different calibration data 2147 according to an operation of the actuator 2130 included therein.

In one or more embodiments, one camera module (e.g., 2100*b*) among the camera modules 2100*a*, 2100*b*, and 2100*c* may be a camera module in the form of a folded lens including the prism 2105 and OPFE 2110 described above, and remaining camera modules (e.g., 2100*a* and 2100*c*) may be vertical camera modules that do not include the prism 2105 and OPFE 2110, but embodiments are not limited thereto.

In one or more embodiments, one camera module (e.g., 2100*c*) among the camera modules 2100*a*, 2100*b*, and 2100*c* may be, e.g., a vertical depth camera that extracts depth information using an infrared ray (IR). In this case, an application processor 1200 may generate a 3D depth image by merging image data provided from the depth camera and image data provided from another camera module (e.g., 2100*a* or 2100*b*).

In one or more embodiments, at least two camera modules (e.g., 2100*a* and 2100*c*) among the camera modules 2100*a*, 2100*b*, and 2100*c* may have different fields of view (viewing angles). In this case, e.g., optical lenses of at least two camera modules (e.g., 2100*a* and 2100*c*) among the camera modules 2100*a*, 2100*b*, and 2100*c* may be different from each other, but embodiments are not limited thereto.

Additionally, in one or more embodiments, the viewing angles of each of the camera modules 2100*a*, 2100*b*, and 2100*c* may be different from each other.

In one or more embodiments, each of the camera modules 2100*a*, 2100*b*, and 2100*c* may be arranged to be physically separated from each other. An independent image sensor 2142 may be disposed inside each of the camera modules 2100*a*, 2100*b*, and 2100*c* rather than dividing a sensing area of one image sensor 2142 into multiple camera modules 2100*a*, 2100*b*, and 2100*c*.

Referring again to FIG. 29, the application processor 2200 may include an image processing device 2210, a memory controller 2220, and an internal memory 2230. The application processor 2200 may be implemented separately from the camera modules 2100*a*, 2100*b*, and 2100*c*. For example, the application processor 2200 and the camera modules 2100*a*, 2100*b*, and 2100*c* may be implemented separately as separate semiconductor chips.

The image processing device 2210 may include a plurality of subimage processors 2212*a*, 2212*b*, and 2212*c*, an image generator 2214, and a camera module controller 2216.

The image processing device 2210 may include a plurality of subimage processors 2212*a*, 2212*b*, and 2212*c* corresponding to a number of camera modules 2100*a*, 2100*b*, and 2100*c*.

Image data generated from each of the camera modules 2100*a*, 2100*b*, and 2100*c* may be provided to the corresponding subimage processors 2212*a*, 2212*b*, and 2212*c* through separate image signal lines ISLa, ISLb, and ISLc. For example, image data generated from the camera module 2100*a* may be supplied to the subimage processor 2212*a* through the image signal line ISLa, image data generated from the camera module 2100*b* may be supplied to the subimage processor 2212*b* through the image signal line ISLb, and image data generated from the camera module 2100*c* may be supplied to the subimage processor 2212*c* through the image signal line ISLc. Such image data transmission may be performed using, e.g., a camera serial interface (CSI) based on a mobile industry processor interface (MIPI), but embodiments are not limited thereto.

In one or more embodiments, one subimage processor may be positioned to correspond to a plurality of camera modules. For example, the subimage processor 2212*a* and the subimage processor 2212*c* may not be implemented separately from each other as shown, but may be integrated into one subimage processor, and the image data supplied from the camera module 2100*a* and the camera module 2100*c* may be selected through a selection element (e.g., multiplexer) and then supplied to the integrated subimage processor.

The image data supplied to each of the subimage processors 2212*a*, 2212*b*, and 2212*c* may be supplied to the image generator 2214. The image generator 2214 may generate an output image using the image data supplied from each of the subimage processors 2212*a*, 2212*b*, and 2212*c* according to image generating information or a mode signal.

In one or more embodiments, the image generator 2214 may receive a plurality of image data with different exposure times from at least one of the subimage processors 2212*a*, 2212*b*, and 2212*c*, and may generate merged image data with an increased dynamic range by performing high dynamic range (HDR) processing on the plurality of image data.

The camera module controller 2216 may supply control signals to each of the camera modules 2100*a*, 2100*b*, and 2100*c*. The control signals generated from the camera module controller 2216 may be supplied to the corresponding camera modules 2100*a*, 2100*b*, and 2100*c* through the separate control signal lines CSLa, CSLb, and CSLc.

The application processor 2200 may store the received image signal, i.e., the encoded image signal, in the internal memory 2230 or the storage 2400 external to the application processor 2200, and may then read and decode the encoded image signal from the memory 2230 or a storage 2400 to display image data generated based on the decoded image signal. For example, a corresponding subprocessor among the subprocessors 2212*a*, 2212*b*, and 2212*c* of the image processing device 2210 may perform decoding and may also perform image processing on the decoded image signal. For example, the image data generated based on the decoded image signal may be displayed on the display 2500.

The PMIC 2300 may supply power, e.g., a power supply voltage, to each of the camera modules 2100*a*, 2100*b*, and 2100*c*. For example, under the control of the application processor 2200, the PMIC 2300 may supply a first power to the camera module 2100*a* through the power signal line PSLa, may supply a second power to the camera module 2100*b* through the power signal line PSLb, and may supply a third power to the camera module 2100*c* through the power signal line PSLc.

The PMIC 2300 may generate a power corresponding to each of the camera modules 2100*a*, 2100*b*, and 2100*c* in response to a power control signal PCON from the application processor 2200, and may also adjust a level of the power. The power control signal PCON may include a power adjustment signal for each operation mode of the camera modules 2100*a*, 2100*b*, and 2100*c*. For example, the operation mode may include a low power mode, and in this case, the power control signal PCON may include information related to a camera module operating in low power mode and a power level to be set. Levels of powers supplied to each of the camera modules 2100*a*, 2100*b*, and 2100*c* may be the same or different from each other. Additionally, the levels of the powers may be changed dynamically.

While embodiments have been described with reference to the figures, it will be understood by those of ordinary skill in the art that various changes in form and details may be made therein without departing from the spirit and scope as defined by the following claims and their equivalents.

What is claimed is:

1. An image sensor comprising:
a pixel comprising:
a photoelectric device configured to generate photoelectric charges;
a charge storage connected to the photoelectric device and configured to store the photoelectric charges;
a driving transistor configured to generate a pixel signal based on a voltage from a first node connected to the photoelectric device;
a transfer transistor comprising:
a vertical transfer gate connected between the first node and a second node, a first region at a first side of the transfer transistor and doped with a first doping concentration; and
a second region at a second side of the transfer transistor and doped with a second doping concentration that is different from the first doping concentration;
an overflow transistor between the second node and the charge storage element; and
a row driver connected to the pixel and configured to control the pixel.

2. The image sensor of claim 1, wherein the first region is a p-type doped region, the second region is an n-type doped region, the first node is connected to the first region, and the second node is connected to the second region.

3. The image sensor of claim 2, wherein the photoelectric device is configured to generate the photoelectric charges during an integration period comprising a first period and a second period, and
wherein the row driver configured to control the pixel to:
transfer first photoelectric charges generated in the photoelectric device to the second node by turning on the overflow transistor during the first period, and
transfer second photoelectric charges generated in the photoelectric device to the first node by turning off the overflow transistor during the second period.

4. The image sensor of claim 3, wherein the pixel further comprises a power voltage line configured to supply a power voltage and a reset transistor connected to the first node, and
wherein the row driver is further configured to control the pixel to reset the first photoelectric charges transferred to the first node in excess of capacity of the charge storage to the power voltage by turning on the reset transistor during the first period.

5. The image sensor of claim 3, wherein the row driver is further configured to control the pixel to repeatedly perform a first operation of turning on the overflow transistor and a second operation of turning off the overflow transistor during the first period.

6. The image sensor of claim 3, wherein the row driver is further configured to perform the second period before the first period.

7. The image sensor of claim 2, wherein the pixel further comprises a power voltage line configured to supply a power voltage and a reset transistor connected to the first node,
wherein the photoelectric device is configured to generate the photoelectric charges during an integration period that comprises a first period, a second period, and a third period, and
wherein the row driver is configured to control the pixel to:
transfer first photoelectric charges generated in the photoelectric device to the first node and reset the first photoelectric charges to the power voltage by turning off the overflow transistor and turning on the reset transistor during the first period, transfer second photoelectric charge generated in the photoelectric device to the second node by turning on the overflow transistor during the second period, and transfer third photoelectric charges generated in the photoelectric device to the first node by turning off the overflow transistor and turning off the reset transistor during the third period.

8. The image sensor of claim 1, wherein a first side of the vertical transfer gate has a first oxide thickness, and a second side of the vertical transfer gate has a second oxide thickness that is different from the first oxide thickness.

9. The image sensor of claim 1, wherein the charge storage is at least one of a storage gate transistor, a storage diode, or a metal-insulator-metal capacitor.

10. The image sensor of claim 1, wherein a potential of the overflow transistor changes between a first level that is higher than a potential level of the first region and a second level that is lower than a potential level of the second region.

11. An image sensor comprising:

a semiconductor substrate comprising a photoelectric conversion region and a first floating diffusion region;

a first vertical transfer transistor extending along a thickness direction of the semiconductor substrate and penetrating at least a portion of the semiconductor substrate;

a first region between the first floating diffusion region at a first side of the first vertical transfer gate and the photoelectric conversion region, the first region having a first conductivity type;

a second region configured to have a second conductivity type at a second side of the first vertical transfer gate;

a charge storage at the second side of the first vertical transfer gate; and an overflow transistor between the first vertical transfer gate and the charge storage element.

12. The image sensor of claim 11, wherein the first region is a p-type doped region, and the second region is an n-type doped region.

13. The image sensor of claim 11, wherein the overflow transistor is configured to transfer photoelectric charges generated in the photoelectric conversion region to the charge storage or the first floating diffusion region, and wherein a potential of the overflow transistor changed between a first level that is higher than a potential level of the first region and a second level that is lower than a potential level of the second region.

14. The image sensor of claim 11, further comprising:

a charge storage region along a thickness direction of the semiconductor substrate in a region of the semiconductor substrate corresponding to the charge storage; and a p-type barrier at opposite sides of the charge storage region and spaced apart from each of the charge storage region and the photoelectric conversion region.

15. The image sensor of claim 14, further comprising:

a pixel isolation pattern comprising a backside deep trench isolation (BDTI) structure at opposite sides of the photoelectric conversion region, wherein the charge storage is in a region corresponding to the pixel isolation pattern.

16. A driving method of an image sensor, comprising:

generating first photoelectric charges during a first period in a photoelectric device connected to a first node;

transferring the first photoelectric charges to a charge storage connected to the first node through a first region at a first side of a vertical transfer gate and having a first conductivity type;

generating second photoelectric charges in the photoelectric device during a second period;

transferring the second photoelectric charges to a second node through a second region at a second side of the vertical transfer gate and having a second conductivity type; and generating a pixel signal based on the charges accumulated in the second node.

17. The driving method of claim 16, further comprising:

resetting the first photoelectric charges transferred to the second node in excess of capacity of the charge storage during the first period to a power voltage.

18. The driving method of claim 16, wherein the image sensor further comprises an overflow transistor between the first node and the charge storage, wherein the transferring to the charge storage device comprising performing a first operation of turning on the overflow transistor, and wherein the transferring to the second node comprises performing a second operation of turning off the overflow transistor.

19. The driving method of claim 18, further comprising:

repeatedly performing the first operation and the second operation during the first period.

20. The driving method of claim 18, wherein the charge storage is at least one of a storage gate transistor, a storage diode, or a metal-insulator-metal capacitor.

* * * * *